US012603651B2

(12) United States Patent
Kim et al.

(10) Patent No.: US 12,603,651 B2
(45) Date of Patent: Apr. 14, 2026

(54) ELECTRONIC DEVICE AND METHOD THAT APPLIES STRESS TO TRANSISTORS

(71) Applicant: SK hynix Inc., Icheon-si (KR)

(72) Inventors: Dae Joon Kim, Icheon-si (KR); Geon Ko, Icheon-si (KR); Min Cheol Kim, Icheon-si (KR); Hyun Jun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 71 days.

(21) Appl. No.: 18/620,037

(22) Filed: Mar. 28, 2024

(65) Prior Publication Data

US 2025/0158613 A1     May 15, 2025

(30) Foreign Application Priority Data

Nov. 14, 2023     (KR) ........................ 10-2023-0157395

(51) Int. Cl.
*H03K 19/003* (2006.01)
*G01R 23/02* (2006.01)
(Continued)

(52) U.S. Cl.
CPC ....... *H03K 19/00384* (2013.01); *G01R 23/02* (2013.01); *G01R 31/2621* (2013.01); *G01R 31/2642* (2013.01); *G01R 31/3183* (2013.01); *G01R 31/318314* (2013.01); *G01R 31/318328* (2013.01); *H03K 3/0315* (2013.01); *H03K 19/018521* (2013.01)

(58) Field of Classification Search
CPC .......... H03K 19/00384; H03K 3/0315; H03K 19/018521; G01R 31/2642; G01R 31/3183; G01R 23/02; G01R 31/2621; G01R 31/318314; G01R 31/318328

USPC ......... 331/57, 176; 324/769, 33; 438/14, 17, 438/18
See application file for complete search history.

(56) References Cited

U.S. PATENT DOCUMENTS

2016/0329897 A1     11/2016  Gu et al.

FOREIGN PATENT DOCUMENTS

KR     1020160092835 A     8/2016

OTHER PUBLICATIONS

Kim et al IRPS 2011 Conference Paper, Reliability Monitoring Ring Oscillator Structures for Isolated/Combined NBTI and PBTI Measurement in High-K Metal Gate Technologies (Year: 2011) Kim et al, NPL, IRPS 2011 (Year: 2011).*

* cited by examiner

*Primary Examiner* — Arnold M Kinkead
(74) *Attorney, Agent, or Firm* — WILLIAM PARK AND ASSOCIATES LTD.

(57)     ABSTRACT

An electronic device includes a control signal generation circuit configured to generate a stress enable signal to enter a stress process and a measurement enable signal to enter a measurement process based on a voltage control signal and configured to generate a cycle signal enable signal for generating a cycle signal, and a cycle signal generation circuit configured to apply stress to a plurality of transistors by supplying the plurality of transistors with a source voltage and a ground voltage when the stress enable signal is activated during the stress process, configured to connect current paths of the plurality of transistors to which the stress is applied when the measurement enable signal is activated during the measurement process, and configured to generate the cycle signal that is cyclically toggled when the cycle signal enable signal is activated.

27 Claims, 14 Drawing Sheets

(51) Int. Cl.
  *G01R 31/26*        (2020.01)
  *G01R 31/3183*      (2006.01)
  *H03K 3/03*         (2006.01)
  *H03K 19/0185*      (2006.01)

RDEC
GEN

RDEC
<1:7>

32

RCTR
GEN

RCTR
<1:7>

FIG. 5

| RDEC<7> | RDEC<6> | RDEC<5> | RDEC<4> | RDEC<3> | RDEC<2> | RDEC<1> | ER<1> | ER<2> | ER<3> |
|---|---|---|---|---|---|---|---|---|---|
| L | L | L | L | L | L | H | H | L | L |
| L | L | L | L | L | H | L | L | H | L |
| L | L | L | L | H | L | L | H | H | L |
| L | L | L | H | L | L | L | L | L | H |
| L | L | H | L | L | L | L | H | L | H |
| L | H | L | L | L | L | L | L | H | H |
| H | L | L | L | L | L | L | H | H | H |

FIG. 7

| | RDEC<1> | RDEC<2> | RDEC<3> | RDEC<4> | RDEC<5> | RDEC<6> | RDEC<7> | RCTR<1> | RCTR<2> | RCTR<3> | RCTR<4> | RCTR<5> | RCTR<6> | RCTR<7> |
|---|---|---|---|---|---|---|---|---|---|---|---|---|---|---|
| | H | L | L | L | L | L | L | H | L | L | L | L | L | L |
| | L | H | L | L | L | L | L | H | H | L | L | L | L | L |
| | L | L | H | L | L | L | L | H | H | H | L | L | L | L |
| | L | L | L | H | L | L | L | H | H | H | H | L | L | L |
| | L | L | L | L | H | L | L | L | L | L | L | H | L | L |
| | L | L | L | L | L | H | L | L | L | L | L | H | H | L |
| | L | L | L | L | L | L | H | L | L | L | L | H | H | H |

| Time Period(Sec) | Degradation(ROD) | Degradation(IDD) | Mutual Consistency (ROD & IDD) |
|---|---|---|---|
| 1 Sec | 1.79% | 1.81% | 98.9% |
| 10 Sec | 2.41% | 2.44% | 98.8% |
| 100 Sec | 3.32% | 3.32% | 100.0% |
| 1,000 Sec | 4.50% | 4.50% | 100.0% |
| 10,000 Sec | 6.15% | 6.10% | 100.8% |
| 100,000 Sec | 8.30% | 8.28% | 100.2% |
| 1,000,000 Sec | 11.30% | 11.24% | 100.5% |

FIG. 13

ELECTRONIC DEVICE AND METHOD THAT APPLIES STRESS TO TRANSISTORS

CROSS-REFERENCE TO RELATED APPLICATION

The present application claims priority under 35 U.S.C. § 119 (a) to Korean Patent Application No. 10-2023-0157395, filed in the Korean Intellectual Property Office on Nov. 14, 2023, the entire disclosure of which is incorporated herein by reference.

BACKGROUND

The present disclosure relates to an electronic device for identically setting a degradation amount of a transistor to which stress is applied and a degradation amount of a transistor that is included, for example, in a ring oscillator to which stress is applied.

In general, the degradation of performance and a reliability problem according to stress appear in a semiconductor device as the semiconductor device continues to operate. Particularly, an N-Channel Metal-Oxide-Semiconductor (NMOS) transistor that is included in the semiconductor device is degraded due to a positive bias temperature instability (PBTI) phenomenon. A P-Channel Metal-Oxide-Semiconductor (PMOS) transistor that is included in the semiconductor device is degraded due to a negative bias temperature instability (NBTI) phenomenon. Such phenomena cause performance degradation of the semiconductor device.

For reference, PBTI refers to a phenomenon in which the threshold voltage of the NMOS transistor rises and the forming of a channel of the NMOS transistor is hindered due to stress when the NMOS transistor continues to maintain a turn-on state. Furthermore, NBTI refers to a phenomenon in which the threshold voltage of the PMOS transistor rises and the forming of a channel of the PMOS transistor is hindered due to stress if the PMOS transistor continues to maintain a turn-on state. In other words, when the NMOS transistor and the PMOS transistor are exposed to BTI, operating timing changes. A timing relation within the semiconductor device may be affected. Degradation of performance p and reduced reliability of the semiconductor device result.

SUMMARY

In an embodiment, an electronic device may include a control signal generation circuit configured to generate a stress enable signal to enter a stress process and a measurement enable signal to enter a measurement process based on a voltage control signal and configured to generate a cycle signal enable signal for generating a cycle signal, and a cycle signal generation circuit configured to apply stress to a plurality of transistors by supplying the plurality of transistors with a source voltage and a ground voltage when the stress enable signal is activated during the stress process, configured to connect current paths of the plurality of transistors to which the stress is applied when the measurement enable signal is activated during the measurement process, and configured to generate the cycle signal that is cyclically toggled when the cycle signal enable signal is activated.

In an embodiment, an electronic device may include a control signal generation circuit configured to generate a stress enable signal to enter a stress process and a measurement enable signal to enter a measurement process based on a voltage control signal and configured to generate a cycle signal enable signal for generating a cycle signal, a resistance control circuit configured to generate a resistance control signal based on an external resistance signal, and a cycle signal generation circuit configured to apply stress to a plurality of transistors when the stress enable signal is activated during the stress process, configured to connect current paths of the plurality of transistors to which the stress is applied when the measurement enable signal is activated during the measurement process, and configured to generate the cycle signal that is cyclically toggled when the cycle signal enable signal is activated. The degradation amount of the plurality of transistors attributable to the stress is adjusted based on the resistance control signal.

In an embodiment, an electronic device may include a first internal device configured to generate a reference frequency signal that is cyclically toggled when a cycle signal enable signal is activated, a second internal device configured to apply stress to a plurality of transistors by supplying the plurality of transistors with a source voltage and a ground voltage when a stress enable signal is activated during a stress process, configured to connect current paths of the plurality of transistors to which the stress is applied when a measurement enable signal is activated during a measurement process, and configured to generate a cycle signal that is cyclically toggled when the cycle signal enable signal is activated, and a cycle signal output device configured to latch the cycle signal in synchronization with the reference frequency signal and configured to generate a cycle output signal from the cycle signal that is latched and the reference frequency signal based on a reference selection signal and a subtraction selection signal.

In an embodiment, a method may include, during a stress process, blocking current paths of a plurality of transistors and applying stress to the plurality of transistors by supplying the plurality of transistors with a source voltage and a ground voltage; and during a measurement process, connecting the current paths of the plurality of transistors and applying a cycle signal through the plurality of transistors.

BRIEF DESCRIPTION OF THE DRAWINGS

FIG. 3 is a block diagram illustrating an embodiment of a resistance control circuit that is included in the electronic device illustrated in FIG. 1.

FIG. 5 is a table showing resistance decoding signals output by the resistance decoding signal generation circuit illustrated in FIG. 4 according to an embodiment.

FIG. 7 is a table showing resistance control signals output by the resistance control signal generation circuit illustrated in FIG. 6 according to an embodiment.

FIG. 9 is a circuit diagram illustrating an embodiment of an oscillator of the cycle signal generation circuit illustrated in FIG. 8.

FIG. 10 is a block diagram illustrating an embodiment of a detection circuit of the electronic device illustrated in FIG. 1.

FIG. 11 is a table showing examples of degradation and mutual consistency values determined by the detection circuit illustrated in FIG. 10 according to an embodiment.

FIG. 13 is a block diagram illustrating an electronic device according to another embodiment of the present disclosure.

DETAILED DESCRIPTION

Figure 1:
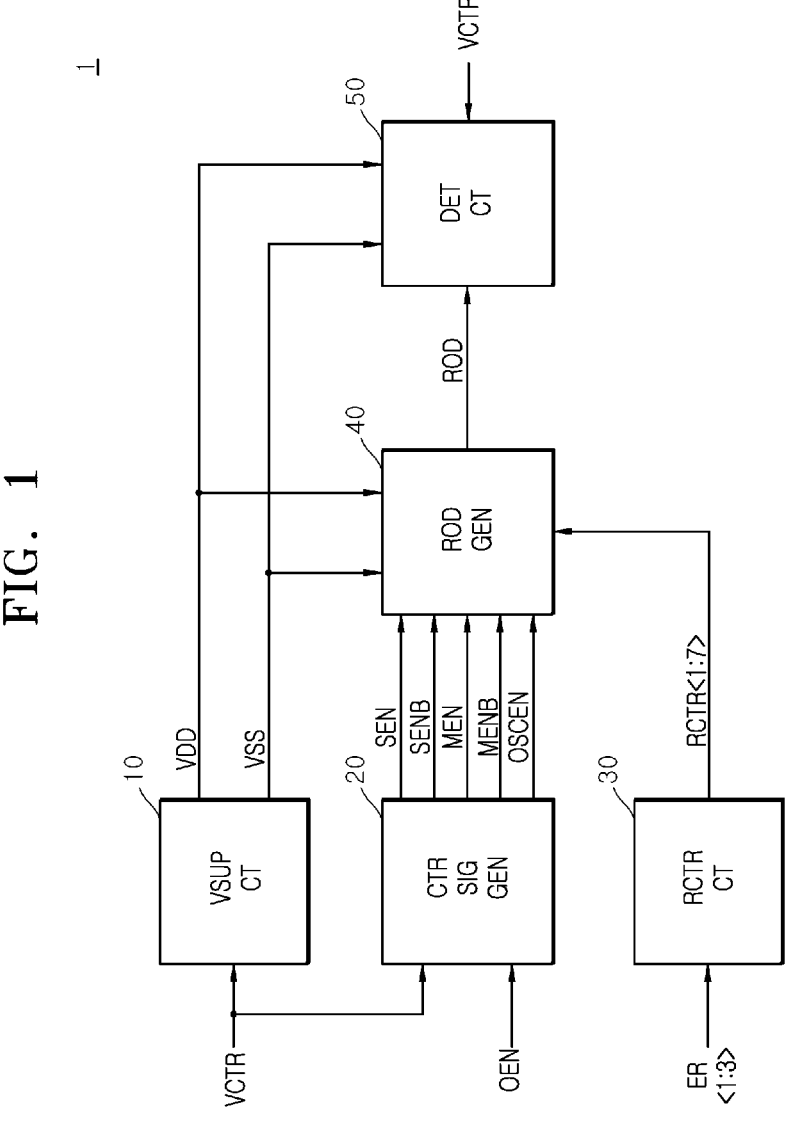
FIG. 1 is a block diagram illustrating an electronic device according to an embodiment of the present disclosure.

According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, the components may be directly coupled or connected to each other or coupled or connected to each other through another component interposed therebetween. In contrast, when one component is referred to as being "directly coupled" or "directly connected" to another component, the components are directly coupled or connected to each other without another component interposed therebetween.

A "logic high level" and a "logic low level" are used to describe the logic levels of signals. A signal at a "logic high level" is distinguished from a signal at a "logic low level." For example, when a signal at a first voltage corresponds to a signal at a "logic high level," a signal at a second voltage may correspond to a signal at a "logic low level." According to an embodiment, a "logic high level" may be set to a voltage higher than a "logic low level." According to an embodiment, the logic levels of signals may be set to different logic levels or opposite logic levels. For example, a signal at a logic high level may be set at a logic low level in some embodiments, and a signal at a logic low level may be set at a logic high level in some embodiments.

The present disclosure is described in detail through embodiments. The embodiments are only used to exemplify the present disclosure, and the scope of the present disclosure is not limited by the embodiments.

Embodiments of the present disclosure may provide an electronic device for applying stress to a plurality of transistors that are included in a cycle signal generation circuit by supplying the plurality of transistors with a source voltage at a high voltage level in a stress process, which may be implemented, for example, as a mode, and monitoring the frequency of a cycle signal by generating the cycle signal through the plurality of transistors to which the stress is applied in a measurement process, which may be implemented, for example, as a mode.

According to an embodiment of the present disclosure, stress may be quickly applied to a plurality of transistors that are included in the cycle signal generation circuit by blocking the current paths of the plurality of transistors that are included in the cycle signal generation circuit during the stress process, to monitor whether the degradation amount of the plurality of transistors that are included in the cycle signal generation circuit and the degradation amount of a reference transistors to which stress is applied are identically set by comparing the degradation amount of the cycle signal that is generated by the cycle signal generation circuit and the degradation amount of an internal current that is generated by a reference transistor during the measurement process, and to accurately detect the degradation amount of a transistor that is actually used by monitoring the frequency of the cycle signal.

Furthermore, according to an embodiment of the present disclosure, stress may be applied to the plurality of transistors that are included in the cycle signal generation circuit by supplying the plurality of transistors with a source voltage at a high voltage level during the stress process and to monitor the frequency of the cycle signal by generating the cycle signal through the plurality of transistors to which the stress is applied during the measurement process.

Furthermore, according to an embodiment of the present disclosure, stress may be quickly applied to the plurality of transistors that are included in the cycle signal generation circuit by blocking the current paths of the plurality of transistors that are included in the cycle signal generation circuit during the stress process.

FIG. 1 is a block diagram illustrating an electronic device 1 according to an embodiment of the present disclosure. As illustrated in FIG. 1, the electronic device 1 includes a voltage supply circuit (VSUP CT) 10, a control signal generation circuit (CTR SIG GEN) 20, a resistance control circuit (RCTR CT) 30, a cycle signal generation circuit (ROD GEN) 40, and a detection circuit (DET CT) 50.

The voltage supply circuit 10 generates a source voltage VDD and a ground voltage VSS based on an external voltage that is supplied from outside the electronic device 1. The voltage supply circuit 10 may generate the source voltage VDD and the ground voltage VSS from the external voltage based on a voltage control signal VCTR. The voltage supply circuit 10 generates the source voltage VDD at a first voltage level (for example, 1.65 V) when the voltage control signal VCTR is enabled or activated during a stress process. The voltage supply circuit 10 generates the source voltage VDD at a second voltage level (for example, 1.35 V) when the voltage control signal VCTR is disabled or deactivated in a measurement process. The voltage supply circuit 10 generates the ground voltage VSS at a third voltage level (for example, 0 V) during the stress process and during the measurement process. The first voltage level may be set as a voltage level higher than the second voltage level. The second voltage level may be set as a voltage level higher than the third voltage level. The voltage control signal VCTR is a signal that is activated at a logic high level during the stress process and that is deactivated at a logic low level during the measurement process in this example. The stress process may include an operation mode for measuring the amount of degradation of the cycle signal generation circuit and a process of applying stress to the cycle signal generation circuit. The stress process may include a process that measures the amount of degradation of the cycle signal generation circuit.

The control signal generation circuit 20 generates a stress enable signal SEN, an inverted stress enable signal SENB, a measurement enable signal MEN, an inverted measurement enable signal MENB, and a cycle signal enable signal OSCEN, based on the voltage control signal VCTR and an outside enable signal OEN. The control signal generation circuit 20 generates the stress enable signal SEN and the inverted stress enable signal SENB that are activated or enabled in order to enter the stress process when the voltage control signal VCTR is activated. The control signal generation circuit 20 generates the measurement enable signal MEN and the inverted measurement enable signal MENB that are activated or enabled in order to enter the measurement process when the voltage control signal VCTR is disabled or deactivated. The control signal generation circuit 20 generates the cycle signal enable signal OSCEN by buffering the outside enable signal OEN. The outside enable signal OEN is a signal that is activated or enabled at a logic high level in order to toggle a cycle signal ROD.

The resistance control circuit 30 generates a first resistance control signal through a seventh resistance control signal RCTR<1:7> based on a first external resistance signal through a third external resistance signal ER<1:3>. The resistance control circuit 30 generates the first resistance control signal through the seventh resistance control signal RCTR<1:7> that are selectively enabled or activated by decoding the first external resistance signal through the third external resistance signals ER<1:3>.

The cycle signal generation circuit 40 applies stress to a plurality of transistors by supplying the plurality of transistors with the source voltage VDD and the ground voltage VSS when the stress enable signal SEN and the inverted stress enable signal SENB are activated during the stress process. The cycle signal generation circuit 40 applies stress to the plurality of transistors by supplying the plurality of transistors with the source voltage VDD at the first voltage level (e.g., 1.65 V) and the ground voltage VSS at the third voltage level (e.g., 0 V) when the stress enable signal SEN and the inverted stress enable signal SENB are activated during the stress process. The cycle signal generation circuit 40 connects the current paths of the plurality of transistors to which the stress is applied when the measurement enable signal MEN and the inverted measurement enable signal MENB are activated during the measurement process. The cycle signal generation circuit 40 is supplied with the source voltage VDD at the second voltage level (e.g., 1.35 V) and the ground voltage VSS at the third voltage level (e.g., 0 V) when the cycle signal enable signal OSCEN is activated during the measurement process and generates the cycle signal ROD that is cyclically toggled, for example, periodically varied between a logic high level and a logic low level, through the plurality of transistors to which the stress is applied.

The detection circuit 50 is supplied with the source voltage VDD at the first voltage level (e.g., 1.65 V) and the ground voltage VSS at the third voltage level (e.g., 0 V) during the stress process based on the voltage control signal VCTR in this example. The detection circuit 50 is supplied with the source voltage VDD at the second voltage level (e.g., 1.35 V) and the ground voltage VSS at the third voltage level (e.g., 0 V) during the measurement process based on the voltage control signal VCTR. The detection circuit 50 monitors an internal current (IDD in FIG. 10) during the measurement process based on the voltage control signal VCTR. The detection circuit 50 may monitor the frequency of the cycle signal ROD during the measurement process based on the voltage control signal VCTR. The detection circuit 50 detects mutual consistency between the degradation amount of the internal current (IDD in FIG. 10) and the degradation amount of the cycle signal ROD during the measurement process based on the voltage control signal VCTR. The detection circuit 50 may be implemented as a test device that is provided outside the electronic device 1 according to an embodiment.

Figure 2:
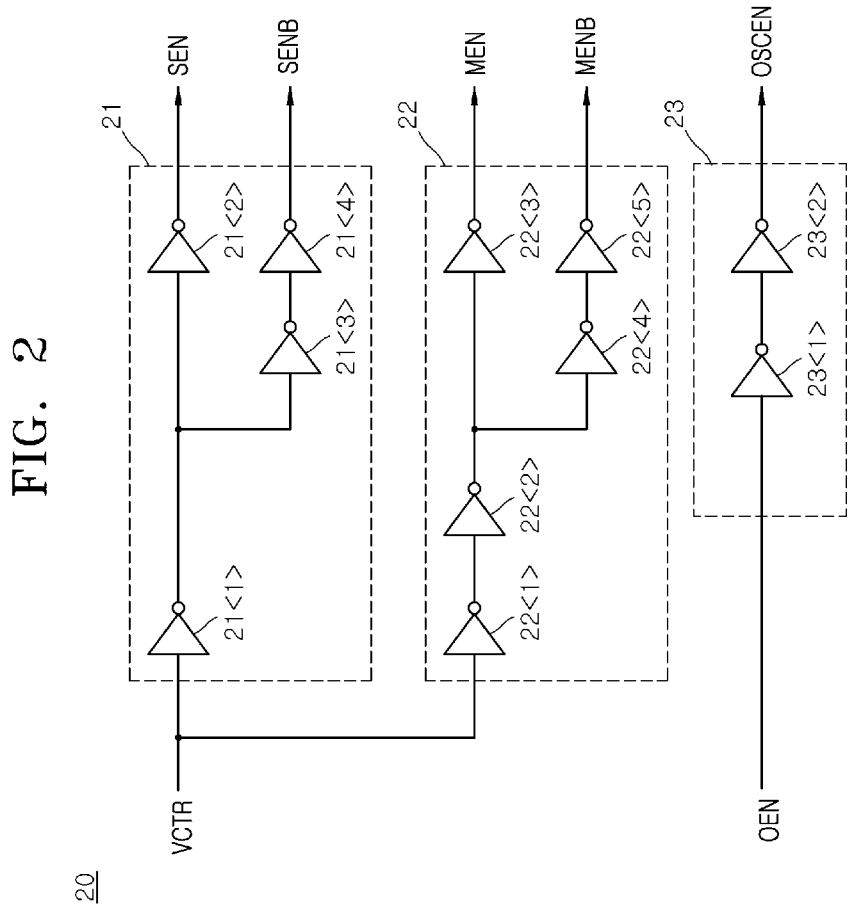
FIG. 2 is a circuit diagram illustrating an embodiment of a control signal generation circuit of the electronic device illustrated in FIG. 1.

FIG. 2 is a block diagram illustrating an embodiment of the control signal generation circuit 20 of the electronic device 1. The control signal generation circuit 20 includes a stress enable signal generation circuit 21, a measurement enable signal generation circuit 22, and a cycle signal enable signal generation circuit 23.

The stress enable signal generation circuit 21 is implemented with inverters 21<1>, 21<2>, 21<3>, and 21<4> in the example of FIG. 2. The stress enable signal generation circuit 21 generates the stress enable signal SEN and the inverted stress enable signal SENB that are activated in order to enter the stress process when the voltage control signal VCTR is activated. The stress enable signal generation circuit 21 may generate the stress enable signal SEN that is activated at a logic high level in order to enter the stress process when the voltage control signal VCTR is activated at a logic high level in this embodiment. The stress enable signal generation circuit 21 generates the inverted stress enable signal SENB that is activated at a logic low level in order to enter the stress process when the voltage control signal VCTR is activated at a logic high level.

The measurement enable signal generation circuit 22 is implemented with inverters 22<1>, 22<2>, 22<3>, 22<4>, and 22<5> in the example of FIG. 2. The measurement enable signal generation circuit 22 generates the measurement enable signal MEN and the inverted measurement enable signal MENB that are activated in order to enter the measurement process when the voltage control signal VCTR is disabled or deactivated. The measurement enable signal generation circuit 22 generates the measurement enable signal MEN that is activated at a logic high level in order to enter or begin the measurement process when the voltage control signal VCTR is deactivated at a logic low level. The measurement enable signal generation circuit 22 may generate the inverted measurement enable signal MENB that is activated at a logic low level in order to enter the measurement process when the voltage control signal VCTR is deactivated at a logic low level.

The cycle signal enable signal generation circuit 23 is implemented with inverters 23<1> and 23<2> in the example of FIG. 2. The cycle signal enable signal generation circuit 23 generates the cycle signal enable signal OSCEN by buffering the outside enable signal OEN. The cycle signal enable signal generation circuit 23 may generate the cycle signal enable signal OSCEN that is activated at a logic high level by buffering the outside enable signal OEN that is activated at a logic high level in order to toggle the cycle signal ROD.

Figure 3:
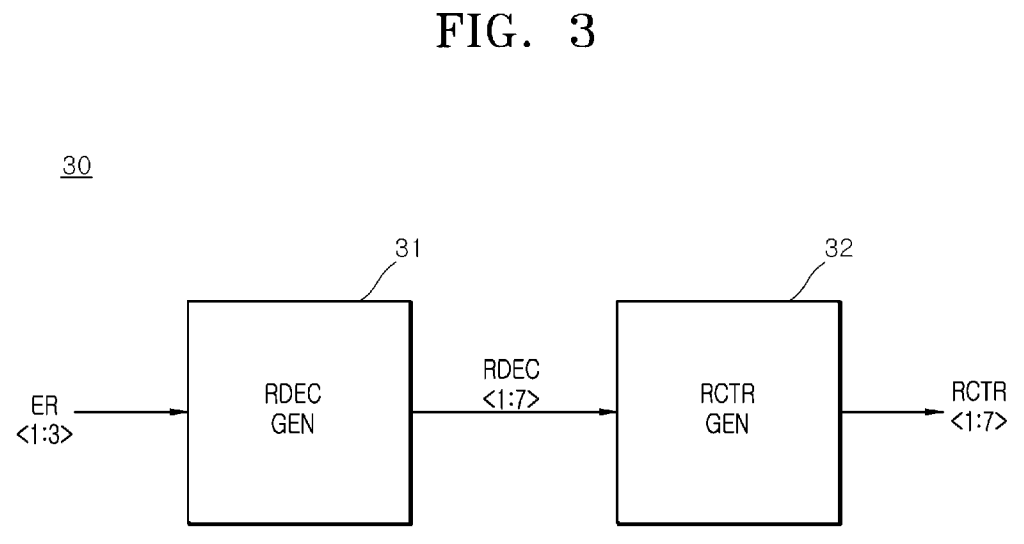

FIG. 3 is a block diagram illustrating an embodiment of the resistance control circuit 30 of the electronic device 1. The resistance control circuit 30 includes a resistance decoding signal generation circuit (RDEC GEN) 31 and a resistance control signal generation circuit (RCTR GEN) 32.

The resistance decoding signal generation circuit 31 generates a first resistance decoding signal RDEC<1>, a second resistance decoding signal RDEC<2>, a third resistance decoding signal RDEC<3>, a fourth resistance decoding signal RDEC<4>, a fifth resistance decoding signal RDEC<5>, a sixth resistance decoding signal RDEC<6>, and a seventh resistance decoding signal RDEC<6>, collectively resistance decoding signals RDEC<1:7> based on the first external resistance signal ER<1>, the second external resistance signal ER<2>, and the third external resistance signal ER<3>, collectively external resistance signals ER<1:

3>. The resistance decoding signal generation circuit 31 generates the first resistance decoding signal through the seventh resistance decoding signal RDEC<1:7> that are selectively activated by decoding the first external resistance signal through the third external resistance signal ER<1:3>. Operation of the resistance decoding signal generation circuit 31 generating the first resistance decoding signal through the seventh resistance decoding signal RDEC<1:7> by decoding the first external resistance signal through the third external resistance signal ER<1:3> is described in detail with reference to FIG. 5.

The resistance control signal generation circuit 32 generates the first resistance control signal through the seventh resistance control signal RCTR<1:7> based on the first resistance decoding signal through the seventh resistance decoding signal RDEC<1:7>, respectively. The resistance control signal generation circuit 32 generate the first resistance control signal through the seventh resistance control signal RCTR<1:7> based on a logic level combination of the first resistance decoding signal through the seventh resistance decoding signal RDEC<1:7>. Operation of the resistance control signal generation circuit 32 generating the first resistance decoding signal through the seventh resistance control signal RCTR<1:7> based on a logic level combination of the first resistance decoding signal through the seventh resistance decoding signals RDEC<1:7> is described in detail with reference to FIG. 7.

Figure 4:
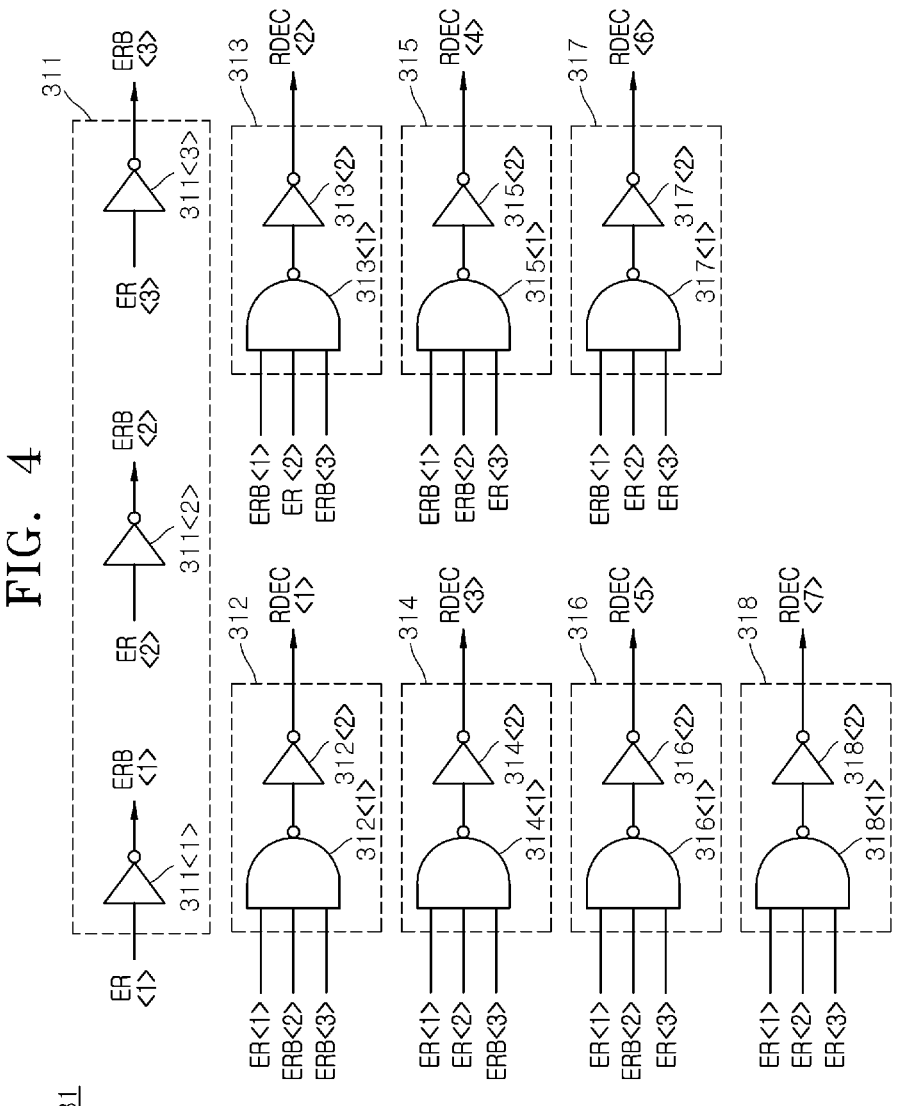
FIG. 4 is a circuit diagram illustrating an embodiment of a resistance decoding signal generation circuit of the resistance control circuit illustrated in FIG. 3.

FIG. 4 is a circuit diagram illustrating an embodiment of the resistance decoding signal generation circuit 31 of the resistance control circuit 30. The resistance decoding signal generation circuit 31 includes an inversion circuit 311, a first resistance decoding signal generation circuit 312, a second resistance decoding signal generation circuit 313, a third resistance decoding signal generation circuit 314, a fourth resistance decoding signal generation circuit 315, a fifth resistance decoding signal generation circuit 316, a sixth resistance decoding signal generation circuit 317, and a seventh resistance decoding signal generation circuit 318.

The inversion circuit 311 is implemented with inverters 311<1>, 311<2>, and 311<3> in the example of FIG. 4. The inverter 311<1> generates a first inverted external resistance signal ERB<1> by inverting the first external resistance signal ER<1>. The inverter 311<2> generates a second inverted external resistance signal ERB<2> by inverting the second external resistance signal ER<2>. The inverter 311<3> generates a third inverted external resistance signal ERB<3> by inverting the third external resistance signal ER<3>. The inversion circuit 311 generates the first inverted external resistance signal through the third inverted external resistance signal ERB<1:3> by inverting the first external resistance signal through the third external resistance signal ER<1:3>, respectively.

The first resistance decoding signal generation circuit 312 is implemented with a NAND gate 312<1> and an inverter 312<2> in the example of FIG. 4. The first resistance decoding signal generation circuit 312 generates the first resistance decoding signal RDEC<1> at a logic high level when the first external resistance signal ER<1> is at a logic high level, the second inverted external resistance signal ERB<2> is at a logic high level, and the third inverted external resistance signal ERB<3> is at a logic high level. For other combinations of the first external resistance signal ER<1>, the second inverted external resistance signal ERB<2>, and the third inverted external resistance signal ERB<3>, the first resistance decoding signal generation circuit 312 generates the first resistance decoding signal RDEC<1> at a logic low level.

The second resistance decoding signal generation circuit 313 is implemented with a NAND gate 313<1> and an inverter 313<2> in the example of FIG. 4. The second resistance decoding signal generation circuit 313 generates the second resistance decoding signal RDEC<2> at a logic high level when the first inverted external resistance signal ERB<1> is at a logic high level, the second external resistance signal ER<2> is at a logic high level, and the third inverted external resistance signal ERB<3> is at a logic high level. For other combinations of the first inverted external resistance signal ERB<1>, the second external resistance signal ER<2>, and the third inverted external resistance signal ERB<3>, the second resistance decoding signal generation circuit 313 generates the second resistance decoding signal RDEC<2> at a logic low level.

The third resistance decoding signal generation circuit 314 is implemented with a NAND gate 314<1> and an inverter 314<2> in the example of FIG. 4. The third resistance decoding signal generation circuit 314 generates the third resistance decoding signal RDEC<3> at a logic high level when the first external resistance signal ER<1> is at a logic high level, the second external resistance signal ER<2> is at a logic high level, and the third inverted external resistance signal ERB<3> is at a logic high level. For other combinations of the first external resistance signal ER<1>, the second external resistance signal ER<2>, and the third inverted external resistance signal ERB<3>, the third resistance decoding signal generation circuit 314 generates the third resistance decoding signal RDEC<3> at a logic low level.

The fourth resistance decoding signal generation circuit 315 is implemented with a NAND gate 315<1> and an inverter 315<2> in the example of FIG. 4. The fourth resistance decoding signal generation circuit 315 generates the fourth resistance decoding signal RDEC<4> at a logic high level when the first inverted external resistance signal ERB<1> is at a logic high level, the second inverted external resistance signal ERB<2> is at a logic high level, and the third external resistance signal ER<3> is at a logic high level. For other combinations of the first inverted external resistance signal ERB<1>, the second inverted external resistance signal ERB<2>, and the third external resistance signal ER<3>, the fourth resistance decoding signal generation circuit 315 generates the fourth resistance decoding signal RDEC<4> at a logic low level.

The fifth resistance decoding signal generation circuit 316 is implemented with a NAND gate 316<1> and an inverter 316<2> in the example of FIG. 4. The fifth resistance decoding signal generation circuit 316 generates the fifth resistance decoding signal RDEC<5> at a logic high level when the first external resistance signal ER<1> is at a logic high level, the second inverted external resistance signal ERB<2> is at a logic high level, and the third external resistance signal ER<3> is at a logic high level. For other combinations of the first external resistance signal ER<1>, the second inverted external resistance signal ERB<2>, and the third external resistance signal ER<3>, the fifth resistance decoding signal generation circuit 316 generates the fifth resistance decoding signal RDEC<5> at a logic low level.

The sixth resistance decoding signal generation circuit 317 is implemented with a NAND gate 317<1> and an inverter 317<2> in the example of FIG. 4. The sixth resistance decoding signal generation circuit 317 generates the sixth resistance decoding signal RDEC<6> at a logic high level when the first inverted external resistance signal ERB<1> is at a logic high level, the second external resistance signal ER<2> is at a logic high level, and the third external resistance signal ER<3> is at a logic high level. For other combinations of the first inverted external resistance signal ERB<1>, the second external resistance signal ER<2>, and the third external resistance signal ER<3>, the sixth resistance decoding signal generation circuit 317 generates the sixth resistance decoding signal RDEC<6> at a logic low level.

The seventh resistance decoding signal generation circuit 318 is implemented with a NAND gate 318<1> and an inverter 318<2> in the example of FIG. 4. The seventh resistance decoding signal generation circuit 318 generates the seventh resistance decoding signal RDEC<7> at a logic high level when the first external resistance signal ER<1> is at a logic high level, the second external resistance signal ER<2> is at a logic high level, and the third external resistance signal ER<3> is at a logic high level. For other combinations of the first external resistance signal ER<1>, the second external resistance signal ER<2>, and the third external resistance signal ER<3>, the seventh resistance decoding signal generation circuit 318 generates the seventh resistance decoding signal RDEC<7> at a logic low level.

FIG. 5 is a table showing resistance decoding signals output by the resistance decoding signal generation circuit 31. Operation of the resistance decoding signal generation circuit 31 according to an embodiment of the present disclosure generating the first resistance decoding signal through the seventh resistance decoding signal RDEC<1:7> by decoding the first external resistance signal through the third external resistance signal ER<1:3> is described as follows with reference to FIG. 5.

The resistance decoding signal generation circuit 31 generates the first resistance decoding signal RDEC<1> at a logic high level H when the first external resistance signal ER<1> is at a logic high level H, the second external resistance signal ER<2> is at a logic low level L, and the third external resistance signal ER<3> is at a logic low level L. For other combinations of the first external resistance signal ER<1>, the second external resistance signal ER<2>, and the third external resistance signal ER<3>, the resistance decoding signal generation circuit 31 generates the first resistance decoding signal RDEC<1> at a logic low level.

The resistance decoding signal generation circuit 31 generates the second resistance decoding signal RDEC<2> at a logic high level H when the first external resistance signal ER<1> is at a logic low level L, the second external resistance signal ER<2> is at a logic high level H, and the third external resistance signal ER<3> is at a logic low level L. For other combinations of the first external resistance signal ER<1>, the second external resistance signal ER<2>, and the third external resistance signal ER<3>, the resistance decoding signal generation circuit 31 generates the second resistance decoding signal RDEC<2> at a logic low level.

The resistance decoding signal generation circuit 31 generates the third resistance decoding signal RDEC<3> at a logic high level H when the first external resistance signal ER<1> is at a logic high level H, the second external resistance signal ER<2> is at a logic high level H, and the third external resistance signal ER<3> is at a logic low level L. For other combinations of the first external resistance signal ER<1>, the second external resistance signal ER<2>, and the third external resistance signal ER<3>, the resistance decoding signal generation circuit 31 generates the third resistance decoding signal RDEC<3> at a logic low level.

The resistance decoding signal generation circuit 31 generates the fourth resistance decoding signal RDEC<4> at a logic high level H when the first external resistance signal ER<1> is at a logic low level L, the second external resistance signal ER<2> is at a logic low level L, and the third external resistance signal ER<3> is at a logic high level H. For other combinations of the first external resistance signal ER<1>, the second external resistance signal ER<2>, and the third external resistance signal ER<3>, the resistance decoding signal generation circuit 31 generates the fourth resistance decoding signal RDEC<4> at a logic low level.

The resistance decoding signal generation circuit 31 generates the fifth resistance decoding signal RDEC<5> at a logic high level H when the first external resistance signal ER<1> is at a logic high level H, the second external resistance signal ER<2> is at a logic low level L, and the third external resistance signal ER<3> is at a logic high level H. For other combinations of the first external resistance signal ER<1>, the second external resistance signal ER<2>, and the third external resistance signal ER<3>, the resistance decoding signal generation circuit 31 generates the fifth resistance decoding signal RDEC<5> at a logic low level.

The resistance decoding signal generation circuit 31 generates the sixth resistance decoding signal RDEC<6> at a logic high level H when the first external resistance signal ER<1> is at a logic low level L, the second external resistance signal ER<2> is at a logic high level H, and the third external resistance signal ER<3> is at a logic high level H. For other combinations of the first external resistance signal ER<1>, the second external resistance signal ER<2>, and the third external resistance signal ER<3>, the resistance decoding signal generation circuit 31 generates the sixth resistance decoding signal RDEC<6> at a logic low level.

The resistance decoding signal generation circuit 31 generates the seventh resistance decoding signal RDEC<7> at a logic high level H when the first external resistance signal ER<1> is at a logic high level H, the second external resistance signal ER<2> is at a logic high level H, and the third external resistance signal ER<3> is at a logic high level H. For other combinations of the first external resistance signal ER<1>, the second external resistance signal ER<2>, and the third external resistance signal ER<3>, the resistance decoding signal generation circuit 31 generates the seventh resistance decoding signal RDEC<7> at a logic low level.

Figure 6:
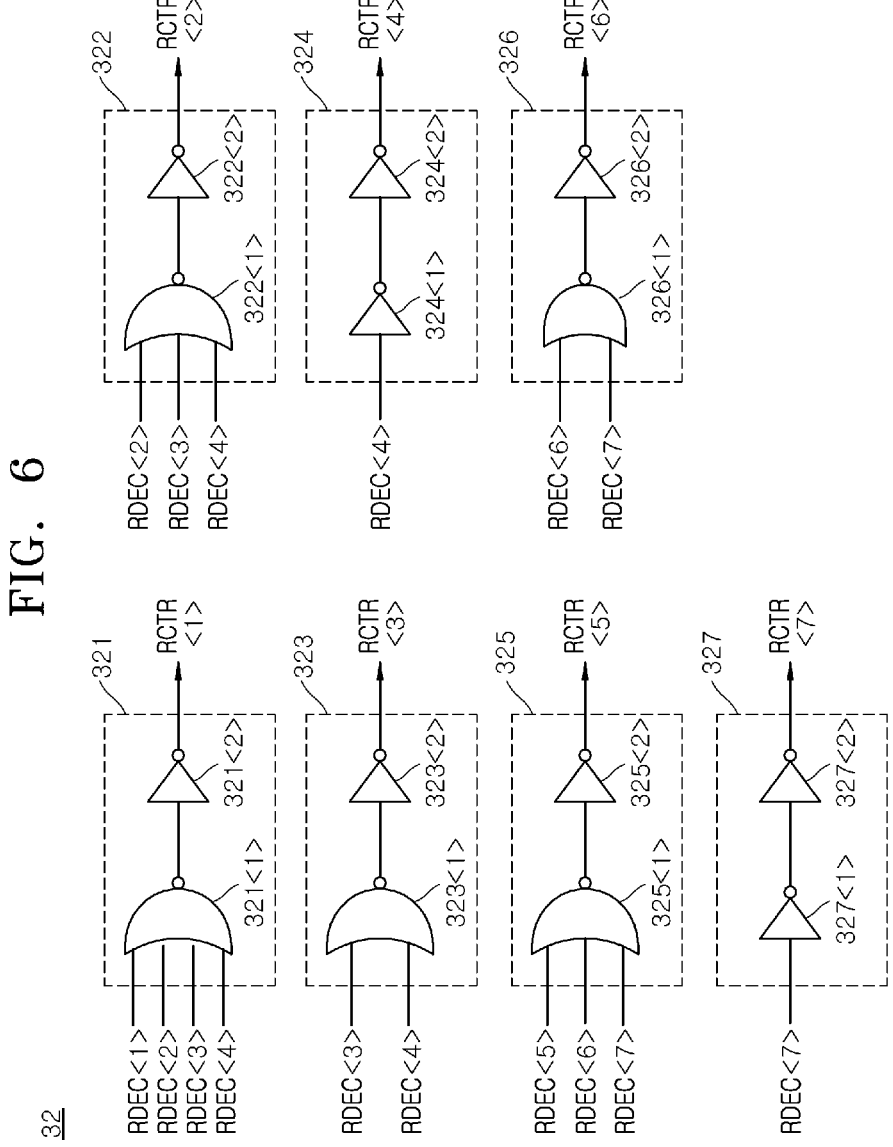
FIG. 6 is a circuit diagram illustrating an embodiment of a resistance control signal generation circuit of the resistance control circuit illustrated in FIG. 3.

FIG. 6 is a circuit diagram illustrating an embodiment of the resistance control signal generation circuit 32 of the resistance control circuit 30. The resistance control signal generation circuit 32 includes a first resistance control signal generation circuit 321, a second resistance control signal generation circuit 322, a third resistance control signal generation circuit 323, a fourth resistance control signal generation circuit 324, a fifth resistance control signal generation circuit 325, a sixth resistance control signal generation circuit 326, and a seventh resistance control signal generation circuit 327.

The first resistance control signal generation circuit 321 is implemented with a NOR gate 321<1> and an inverter 321<2> in the example of FIG. 6. The first resistance control signal generation circuit 321 generates the first resistance control signal RCTR<1> at a logic high level when at least one of the first resistance decoding signal RDEC<1>, the second resistance decoding signal RDEC<2>, the third resistance decoding signal RDEC<3>, and the fourth resistance decoding signal RDEC<4> is at a logic high level. The first resistance control signal generation circuit 321 generates the first resistance control signal RCTR<1> at a logic low level when none of the first resistance decoding signal RDEC<1>, the second resistance decoding signal RDEC<2>, the third resistance decoding signal RDEC<3>, and the fourth resistance decoding signal RDEC<4> is at a logic high level.

The second resistance control signal generation circuit 322 is implemented with a NOR gate 322<1> and an inverter 322<2> in the example of FIG. 6. The second resistance control signal generation circuit 322 generates the second resistance control signal RCTR<2> at a logic high level when at least one of the second resistance decoding signal RDEC<2>, the third resistance decoding signal RDEC<3>, and the fourth resistance decoding signal RDEC<4> is at a logic high level. The second resistance control signal generation circuit 322 generates the second resistance control signal RCTR<2> at a logic low level when none of the second resistance decoding signal RDEC<2>, the third resistance decoding signal RDEC<3>, and the fourth resistance decoding signal RDEC<4> is at a logic high level.

The third resistance control signal generation circuit 323 is implemented with a NOR gate 323<1> and an inverter 323<2> in the example of FIG. 6. The third resistance control signal generation circuit 323 generates the third resistance control signal RCTR<3> at a logic high level when at least one of the third resistance decoding signal RDEC<3> and the fourth resistance decoding signal RDEC<4> is at a logic high level. The third resistance control signal generation circuit 323 generates the third resistance control signal RCTR<3> at a logic low level when none of the third resistance decoding signal RDEC<3> and the fourth resistance decoding signal RDEC<4> is at a logic high level.

The fourth resistance control signal generation circuit 324 is implemented with inverters 324<1> and 324<2> in the example of FIG. 6. The fourth resistance control signal generation circuit 324 generates the fourth resistance control signal RCTR<4> at a logic high level when the fourth resistance decoding signal RDEC<4> is at a logic high level. The fourth resistance control signal generation circuit 324 generates the fourth resistance control signal RCTR<4> at a logic low level when the fourth resistance decoding signal RDEC<4> is at a logic low level.

The fifth resistance control signal generation circuit 325 is implemented with a NOR gate 325<1> and an inverter 325<2> in the example of FIG. 6. The fifth resistance control signal generation circuit 325 generates the fifth resistance control signal RCTR<5> at a logic high level when at least one of the fifth resistance decoding signal RDEC<5>, the sixth resistance decoding signal RDEC<6>, and the seventh resistance decoding signal RDEC<7> is at a logic high level. The fifth resistance control signal generation circuit 325 generates the fifth resistance control signal RCTR<5> at a logic low level when none of the fifth resistance decoding signal RDEC<5>, the sixth resistance decoding signal RDEC<6>, and the seventh resistance decoding signal RDEC<7> is at a logic high level.

The sixth resistance control signal generation circuit 326 is implemented with a NOR gate 326<1> and an inverter 326<2> in the example of FIG. 6. The sixth resistance control signal generation circuit 326 generates the sixth resistance control signal RCTR<6> at a logic high level when at least one of the sixth resistance decoding signal RDEC<6> and the seventh resistance decoding signal RDEC<7> is at a logic high level. The sixth resistance control signal generation circuit 326 generates the sixth resistance control signal RCTR<6> at a logic low level when none of the sixth resistance decoding signal RDEC<6> and the seventh resistance decoding signal RDEC<7> is at a logic high level.

The seventh resistance control signal generation circuit 327 is implemented with inverters 327<1> and 327<2> in the example of FIG. 6. The seventh resistance control signal generation circuit 327 generates the seventh resistance control signal RCTR<7> at a logic high level when the seventh resistance decoding signal RDEC<7> is at a logic high level. The seventh resistance control signal generation circuit 327 generates the seventh resistance control signal RCTR<7> at a logic low level when the seventh resistance decoding signal RDEC<7> is at a logic low level.

FIG. 7 is a table showing resistance control signals output by the resistance control signal generation circuit 32 according to an embodiment. Operation of the resistance control signal generation circuit 32 according to an embodiment of the present disclosure generating the first resistance control signal through the seventh resistance control signal RCTR<1:7> based on the logic levels of the first resistance decoding signal through the seventh resistance decoding signals RDEC<1:7> is described as follows with reference to FIG. 7.

The resistance control signal generation circuit 32 generates the first resistance control signal RCTR<1> at a logic high level H when the first resistance decoding signal RDEC<1> is at a logic high level H.

The resistance control signal generation circuit 32 generates the first resistance control signal RCTR<1> at a logic high level H and the second resistance control signal RCTR<2> at a logic high level H when the second resistance decoding signal RDEC<2> is at a logic high level H.

The resistance control signal generation circuit 32 generates the first resistance control signal RCTR<1> at a logic high level H, the second resistance control signal RCTR<2> at a logic high level H, and the third resistance control signal RCTR<3> at a logic high level H when the third resistance decoding signal RDEC<3> is at a logic high level H.

The resistance control signal generation circuit 32 generates the first resistance control signal RCTR<1> at a logic high level H, the second resistance control signal RCTR<2> at a logic high level H, the third resistance control signal RCTR<3> at a logic high level H, and the fourth resistance control signal RCTR<4> at a logic high level H when the fourth resistance decoding signal RDEC<4> is at a logic high level H.

The resistance control signal generation circuit 32 generates the fifth resistance control signal RCTR<5> at a logic high level H when the fifth resistance decoding signal RDEC<5> is at a logic high level H.

The resistance control signal generation circuit 32 may generate the fifth resistance control signal RCTR<5> at a logic high level H and the sixth resistance control signal RCTR<6> at a logic high level H when the sixth resistance decoding signal RDEC<6> is at a logic high level H.

The resistance control signal generation circuit 32 generates the fifth resistance control signal RCTR<5> at a logic high level H, the sixth resistance control signal RCTR<6> at a logic high level H, and the seventh resistance control signal RCTR<7> at a logic high level H when the seventh resistance decoding signal RDEC<7> is at a logic high level H.

The resistance control signal generation circuit 32 generates the first resistance control signal RCTR<1> at a logic low level L, the second resistance control signal RCTR<2> at a logic low level L, the third resistance control signal RCTR<3> at a logic low level L, the fourth resistance control signal RCTR<4> at a logic low level L, the fifth resistance control signal RCTR<5> at a logic low level L, the sixth resistance control signal RCTR<6> at a logic low level L, and the seventh resistance control signal RCTR<7> at a logic low level L except when the resistance control signals RCTR<1:7> are generated at a logic high level H as described above, such as shown in FIG. 7.

Figure 8:
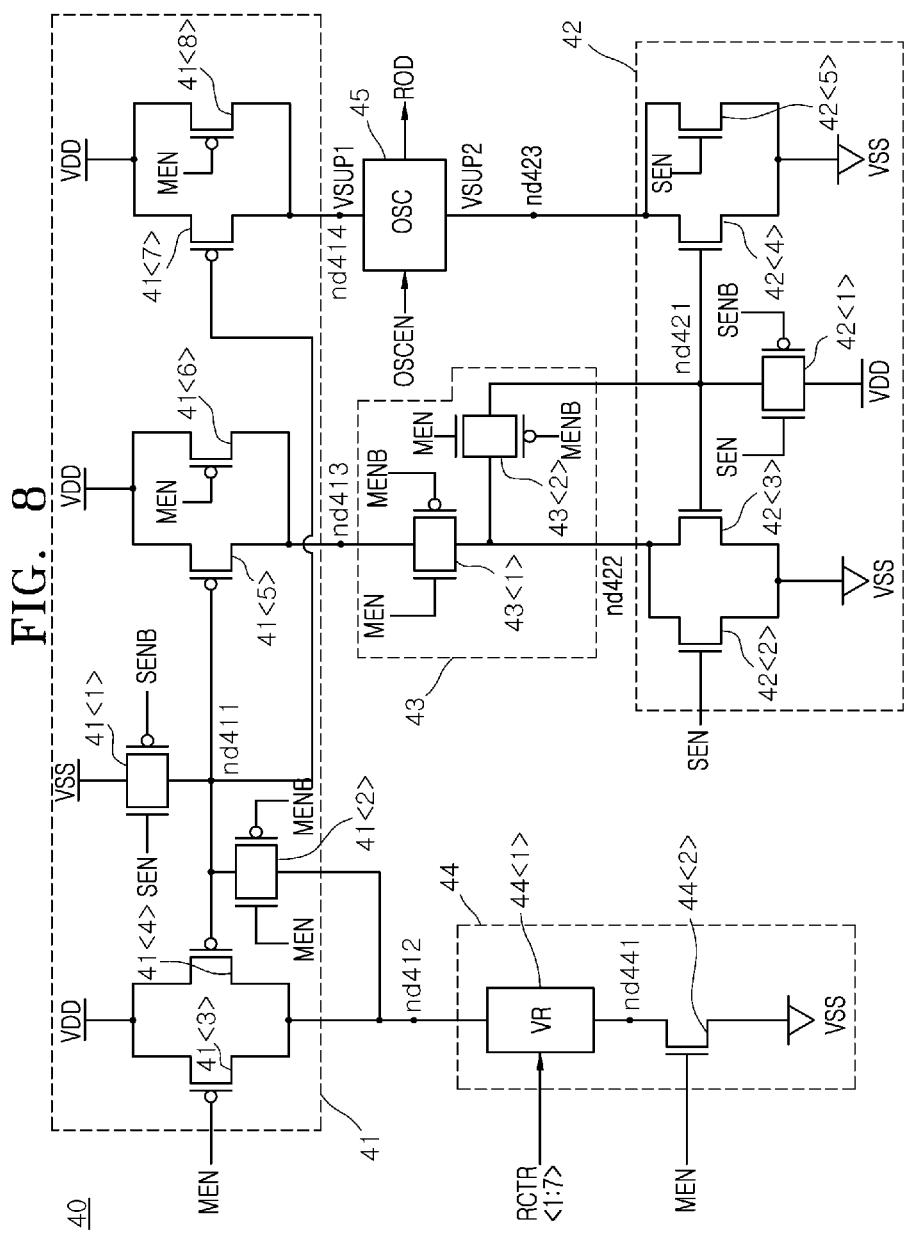
FIG. 8 is a circuit diagram illustrating an embodiment of a cycle signal generation circuit of the electronic device illustrated in FIG. 1.

FIG. 8 is a circuit diagram illustrating an embodiment of the cycle signal generation circuit 40 of the electronic device 1. The cycle signal generation circuit 40 include a first supply voltage generation circuit 41, a second supply voltage generation circuit 42, a connection circuit 43, a degradation amount adjustment circuit 44, and an oscillator 45.

In the example of FIG. 8, the first supply voltage generation circuit 41 includes a first switch 41<1> that is disposed between the ground voltage VSS and a node nd411 and that is turned on when the stress enable signal SEN and the inverted stress enable signal SENB are activated. The first supply voltage generation circuit 41 includes a second switch 41<2> that is disposed between the node nd411 and a node nd412 and that is turned on when the measurement enable signal MEN and the inverted measurement enable signal MENB are activated. The first supply voltage generation circuit 41 includes a PMOS transistor 41<3> that is disposed between the source voltage VDD and the node nd412 and that is turned on when the measurement enable signal MEN is deactivated. The first supply voltage generation circuit 41 includes a PMOS transistor 41<4> that is disposed between the source voltage VDD and the node nd412 and that is turned on when the node nd411 is at the voltage level of the ground voltage VSS. The first supply voltage generation circuit 41 includes a PMOS transistor 41<5> that is disposed between the source voltage VDD and a node nd413 and that is turned on when the node nd411 is at the voltage level of the ground voltage VSS. The first supply voltage generation circuit 41 includes a PMOS transistor 41<6> that is disposed between the source voltage VDD and the node nd413 and that is turned on when the measurement enable signal MEN is deactivated. The first supply voltage generation circuit 41 includes a PMOS transistor 41<7> that is disposed between the source voltage VDD and a node nd414 and that is turned on when the node nd411 is at the voltage level of the ground voltage VSS. The first supply voltage generation circuit 41 includes a PMOS transistor 41<8> that is disposed between the source voltage VDD and the node nd414 and that is turned on when the measurement enable signal MEN is deactivated.

The PMOS transistor 41<4>, PMOS transistor 41<5>, and PMOS transistor 41<7> of the first supply voltage generation circuit 41 are turned on when the stress enable signal SEN is activated at a logic high level and the inverted stress enable signal SENB is activated at a logic low level during the stress process. The PMOS transistor 41<3> is turned on when the measurement enable signal MEN is deactivated at a logic low level during the stress process, and the first supply voltage generation circuit 41 drives the node nd412 at the voltage level of the source voltage VDD at the first voltage level (e.g., 1.65 V). The PMOS transistor 41<6> is turned on when the measurement enable signal MEN is deactivated at a logic low level during the stress process, and the first supply voltage generation circuit 41 drives the node nd413 at the voltage level of the source voltage VDD at the first voltage level (e.g., 1.65 V). The PMOS transistor 41<8> is turned on when the measurement enable signal MEN is deactivated at a logic low level during the stress process, and the first supply voltage generation circuit 41 generates a first supply voltage VSUP1 at the first voltage level (e.g., 1.65 V). Stress is applied to the PMOS transistor 41<4>, the PMOS transistor 41<5>, and the PMOS transistor 41<7> of the first supply voltage generation circuit 41 by the source voltage VDD at the first voltage level (e.g., 1.65 V) when the stress enable signal SEN is activated at a logic high level and the inverted stress enable signal SENB is activated at a logic low level during the stress process.

In the first supply voltage generation circuit 41, the node nd411 that is connected to gates of the PMOS transistor 41<4>, the PMOS transistor 41<5>, and the PMOS transistor 41<7> and the node nd412 are connected when the measurement enable signal MEN is activated at a logic high level and the inverted measurement enable signal MENB is activated at a logic low level during the measurement process, such that each of the PMOS transistor 41<4>, the PMOS transistor 41<5>, and the PMOS transistor 41<7> performs as a diode.

In the example of FIG. 8, the second supply voltage generation circuit 42 includes a third switch 42<1> that is disposed between the source voltage VDD and a node nd421 and that is turned on when the stress enable signal SEN and the inverted stress enable signal SENB are activated. The second supply voltage generation circuit 42 includes an NMOS transistor 42<2> that is disposed between a node nd422 and the ground voltage VSS and that is turned on when the stress enable signal SEN is activated. The second supply voltage generation circuit 42 includes an NMOS transistor 42<3> that is disposed between the node nd422 and the ground voltage VSS and that is turned on when the node nd421 is at the voltage level of the source voltage VDD. The second supply voltage generation circuit 42 includes an NMOS transistor 42<4> that is disposed between a node nd423 and the ground voltage VSS and that is turned on when the node nd421 is at the voltage level of the source voltage VDD. The second supply voltage generation circuit 42 includes an NMOS transistor 42<5> that is disposed between the node nd423 and the ground voltage VSS and that is turned on when the stress enable signal SEN is activated.

The NMOS transistor 42<1> is turned on when the stress enable signal SEN is activated at a logic high level and the inverted stress enable signal SENB is activated at a logic low level during the stress process, thus the second supply voltage generation circuit 42 drives the node nd421 at the voltage level of the ground voltage VSS at the third voltage level (e.g., 0 V). The NMOS transistor 42<2>, NMOS transistor 42<3>, NMOS transistor 42<4>, and NMOS transistor 42<5> of the second supply voltage generation circuit 42 may be turned on when the stress enable signal SEN is activated at a logic high level and the inverted stress enable signal SENB is activated at a logic low level during the stress process. Stress is applied to the NMOS transistor 42<3> and NMOS transistor 42<4> of the second supply voltage generation circuit 42 by the source voltage VDD at the first voltage level (e.g., 1.65 V) when the stress enable signal SEN is activated at a logic high level and the inverted stress enable signal SENB is activated at a logic low level during the stress process. The NMOS transistor 42<2> is turned on when the stress enable signal SEN is activated at a logic high level during the stress process, thus the second supply voltage generation circuit 42 drives the node nd422 at the voltage level of the ground voltage VSS having the third voltage level (e.g., 0 V). The NMOS transistor 42<5> is turned on when the stress enable signal SEN is activated at a logic high level during the stress process, thus the second supply voltage generation circuit 42 drives the node nd423 at the voltage level of the ground voltage VSS having the third voltage level (e.g., 0 V). The NMOS transistor 42<5> is turned on when the stress enable signal SEN is activated at a logic high level during the stress process, thus the second supply voltage generation circuit 42 generates a second supply voltage VSUP2 at the third voltage level (e.g., 0 V).

In the second supply voltage generation circuit 42, the node nd421, that is connected to gates of the NMOS transistor 42<3> and the NMOS transistor 42<4>, is connected to the node nd422 when the measurement enable signal MEN is activated at a logic high level and the inverted measurement enable signal MENB is activated at a logic low level during the measurement process, such that each of the NMOS transistor 42<3> and the NMOS transistor 42<4> performs as a diode.

The second supply voltage generation circuit 42 drives the node nd423 at the voltage level of the ground voltage VSS by the NMOS transistor 42<4> to which stress is applied during the measurement process. The second supply voltage generation circuit 42 generates the second supply voltage VSUP2 by driving the node nd423 by the NMOS transistor 42<4> to which stress is applied during the measurement process.

The connection circuit 43 includes a fifth switch 43<1> that is disposed between the node nd413 and the node nd422 and that is turned on when the measurement enable signal MEN is activated at a logic high level and the inverted measurement enable signal MENB is activated at a logic low level. The connection circuit 43 includes a sixth switch 43<2> that is disposed between the node nd421 and the node nd422 and that is turned on when the measurement enable signal MEN is activated at a logic high level and the inverted measurement enable signal MENB is activated at a logic low level.

The fifth switch 43<1> of the connection circuit 43 is turned off when the measurement enable signal MEN is deactivated at a logic low level and the inverted measurement enable signal MENB is deactivated at a logic high level during the stress process. The connection circuit 43 blocks a current path by turning off the fifth switch 43<1> when the measurement enable signal MEN is deactivated at a logic low level and the inverted measurement enable signal MENB is deactivated at a logic high level during the stress process. The current path may include, for example, the movement of a current that flows from the source voltage VDD to the ground voltage VSS through the node nd413 and the node nd422.

The fifth switch 43<1> is turned on when the measurement enable signal MEN is activated at a logic high level and the inverted measurement enable signal MENB is activated at a logic low level, such that the connection circuit 43 connects the node nd413 and the node nd422 during the measurement process. The sixth switch 43<2> is turned on when the measurement enable signal MEN is activated at a logic high level and the inverted measurement enable signal MENB is activated at a logic low level, such that the connection circuit 43 connects the node nd421 and the node nd422 during the measurement process.

The degradation amount adjustment circuit 44 includes a variable resistor 44<1> that is disposed between the node nd412 and a node nd441 and that has a resistance value adjusted by the first resistance control signal through the seventh resistance control signal RCTR<1:7> and an NMOS transistor 44<2> that is disposed between the node nd441 and the ground voltage VSS and that is turned on when the measurement enable signal MEN is activated.

In the degradation amount adjustment circuit 44, when the measurement enable signal MEN is activated at a logic high level during the measurement process, the amount of current that is discharged from the node nd412 to the ground voltage VSS is adjusted by the variable resistor 44<1> having a resistance value adjusted by the first resistance control signal through the seventh resistance control signal RCTR<1:7>. In the degradation amount adjustment circuit 44, when the measurement enable signal MEN is activated at a logic high level during the measurement process, the amount of current that is discharged from the node nd412 to the ground voltage VSS is increased when a resistance value of the variable resistor 44<1> is decreased by the first resistance control signal through the seventh resistance control signal RCTR<1:7>.

In the degradation amount adjustment circuit 44, when the amount of current that is discharged from the node nd412 to the ground voltage VSS is decreased because the resistance value of the variable resistor 44<1> is increased, stress that is applied to the PMOS transistor 41<4>, the PMOS transistor 41<5>, and the PMOS transistor 41<7> of the first supply voltage generation circuit 41 is increased, such that the degradation amount of the PMOS transistor 41<4>, the PMOS transistor 41<5>, and the PMOS transistor 41<7> may be increased. In the degradation amount adjustment circuit 44, when the amount of current that is discharged from the node nd412 to the ground voltage VSS is decreased because the resistance value of the variable resistor 44<1> is increased, stress that is applied to the NMOS transistor 42<3> and NMOS transistor 42<4> of the second supply voltage generation circuit 42 is increased, such that the degradation amount of the NMOS transistor 42<3> and the NMOS transistor 42<4> may be increased.

In the degradation amount adjustment circuit 44, when the amount of current that is discharged from the node nd412 to the ground voltage VSS is increased because a resistance value of the variable resistor 44<1> is decreased, stress that is applied to the PMOS transistor 41<4>, PMOS transistor 41<5>, and PMOS transistor 41<7> of the first supply voltage generation circuit 41 is decreased, such that the degradation amount of the PMOS transistor 41<4>, the PMOS transistor 41<5>, and the PMOS transistor 41<7> may be decreased. In the degradation amount adjustment circuit 44, when the amount of current that is discharged from the node nd412 to the ground voltage VSS is increased because a resistance value of the variable resistor 44<1> is decreased, stress that is applied to the NMOS transistor 42<3> and NMOS transistor 42<4> of the second supply voltage generation circuit 42 is decreased, such that the degradation amount of the NMOS transistor 42<3> and the NMOS transistor 42<4> may be decreased.

The oscillator 45 is disposed between the node nd414 and the node nd423. The oscillator is provided with or receives the first supply voltage VSUP1 and the second supply voltage VSUP2. Stress is applied to a plurality of transistors of the oscillator 45 by the first supply voltage VSUP1 at the first voltage level (e.g., 1.65 V) and the second supply voltage VSUP2 at the third voltage level (e.g., 0 V) during the stress process. When the cycle signal enable signal OSCEN is activated, the oscillator 45 generates the cycle signal ROD that is cyclically toggled through the plurality of transistors to which the stress is applied. The oscillator 45 may be implemented as a ring oscillator in which an odd number of inverters are connected in series when the cycle signal enable signal OSCEN is activated.

Figure 9:
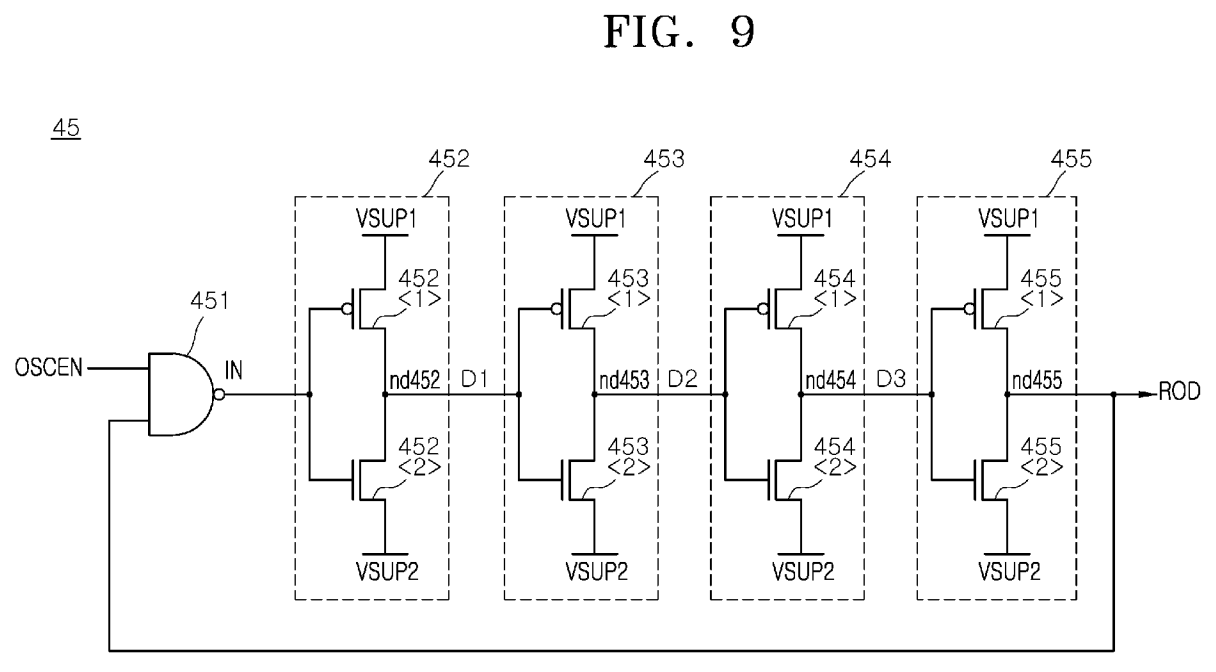

FIG. 9 is a circuit diagram illustrating an embodiment of the oscillator 45 of the cycle signal generation circuit 40. The oscillator 45 includes an input signal generation circuit 451, a first inverter 452, a second inverter 453, a third inverter 454, and a fourth inverter 455.

The input signal generation circuit 451 is implemented as a NAND gate in the example of FIG. 9. The input signal generation circuit 451 generates an input signal IN by inverting the cycle signal ROD when the cycle signal enable signal OSCEN is activated at a logic high level. The input signal generation circuit 451 generates the input signal IN at a logic high level when the cycle signal enable signal OSCEN is deactivated at a logic low level.

The first inverter 452 includes a PMOS transistor 452<1> that is disposed between the first supply voltage VSUP1 and a node nd452 and that is turned on when the input signal IN is at a logic low level and includes an NMOS transistor 452<2> that is disposed between the node nd452 and the second supply voltage VSUP2 and that is turned on when the input signal IN is at a logic high level. Stress is applied to the NMOS transistor 452<2> by the second supply voltage VSUP2 at the third voltage level (e.g., 0 V) when the input signal IN has a logic high level during the stress process. The PMOS transistor 452<1> is turned on when the input signal IN is at a logic low level, thus the first inverter 452 generates a first delay signal D1 by driving the node nd452 at the voltage level of the first supply voltage VSUP1. The NMOS transistor 452<2> is turned on when the input signal IN is at a logic high level, thus the first inverter 452 generates the first delay signal D1 by driving the node nd452 at the voltage level of the second supply voltage VSUP2.

The second inverter 453 includes a PMOS transistor 453<1> that is disposed between the first supply voltage VSUP1 and a node nd453 and that is turned on when the first delay signal D1 is at a logic low level and includes an NMOS transistor 453<2> that is disposed between the node nd453 and the second supply voltage VSUP2 and that is turned on when the first delay signal D1 is at a logic high level. Stress is applied to the PMOS transistor 453<1> by the first supply voltage VSUP1 at the first voltage level (e.g., 1.65 V) when the first delay signal D1 is at a logic low level during the stress process. The PMOS transistor 453<1> is turned on when the first delay signal D1 is at a logic low level, thus the second inverter 453 generates a second delay signal D2 by driving the node nd453 at the voltage level of the first supply voltage VSUP1. The NMOS transistor 453<2> is turned on when the first delay signal D1 is at a logic high level, thus the second inverter 453 generates the second delay signal D2 by driving the node nd453 at the voltage level of the second supply voltage VSUP2.

The third inverter 454 includes a PMOS transistor 454<1> that is disposed between the first supply voltage VSUP1 and a node nd454 and that is turned on when the second delay signal D2 is at a logic low level and an NMOS transistor 454<2> that is disposed between the node nd454 and the second supply voltage VSUP2 and that is turned on when the second delay signal D2 is at a logic high level. Stress is applied to the NMOS transistor 454<2> by the second supply voltage VSUP2 at the third voltage level (e.g., 0 V) when the second delay signal D2 is at a logic high level during the stress process. The PMOS transistor 454<1> is turned on when the second delay signal D2 is at a logic low level, thus the third inverter 454 generates a third delay signal D3 by driving the node nd454 at the voltage level of the first supply voltage VSUP1. The NMOS transistor 454<2> is turned on when the second delay signal D2 is at a logic high level, thus the third inverter 454 generates the third delay signal D3 by driving the node nd454 at the voltage level of the second supply voltage VSUP2.

The fourth inverter 455 includes a PMOS transistor 455<1> that is disposed between the first supply voltage VSUP1 and a node nd455 and that is turned on when the third delay signal D3 is at a logic low level and includes an NMOS transistor 455<2> that is disposed between the node nd455 and the second supply voltage VSUP2 and that is turned on when the third delay signal D3 is at a logic high level. Stress is applied to the PMOS transistor 455<1> by the first supply voltage VSUP1 at the first voltage level (e.g., 1.65 V) when the third delay signal D3 is at a logic low level during the stress process. The PMOS transistor 455<1> is turned on when the third delay signal D3 is at a logic low level, thus the fourth inverter 455 generates the cycle signal ROD by driving the node nd455 at the voltage level of the first supply voltage VSUP1. The NMOS transistor 455<2> is turned on when the third delay signal D3 is at a logic high level, thus the fourth inverter 455 generates the cycle signal ROD by driving the node nd455 at the voltage level of the second supply voltage VSUP2.

The oscillator 45 may be implemented as a ring oscillator in which an odd number of inverters are connected in series because the input signal generation circuit 451 operates like an inverter when the cycle signal enable signal OSCEN is activated at a logic high level. The oscillator 45 generates the cycle signal ROD that is cyclically toggled because the input signal generation circuit 451 operates like an inverter, thus the odd number of inverters is connected in series when the cycle signal enable signal OSCEN is activated at a logic high level. The oscillator 45 generates the cycle signal ROD, the level of which is fixed at a logic high level because the input signal generation circuit 451 operates as a NAND gate that performs a NAND operation when the cycle signal enable signal OSCEN is deactivated at a logic low level.

Figure 10:
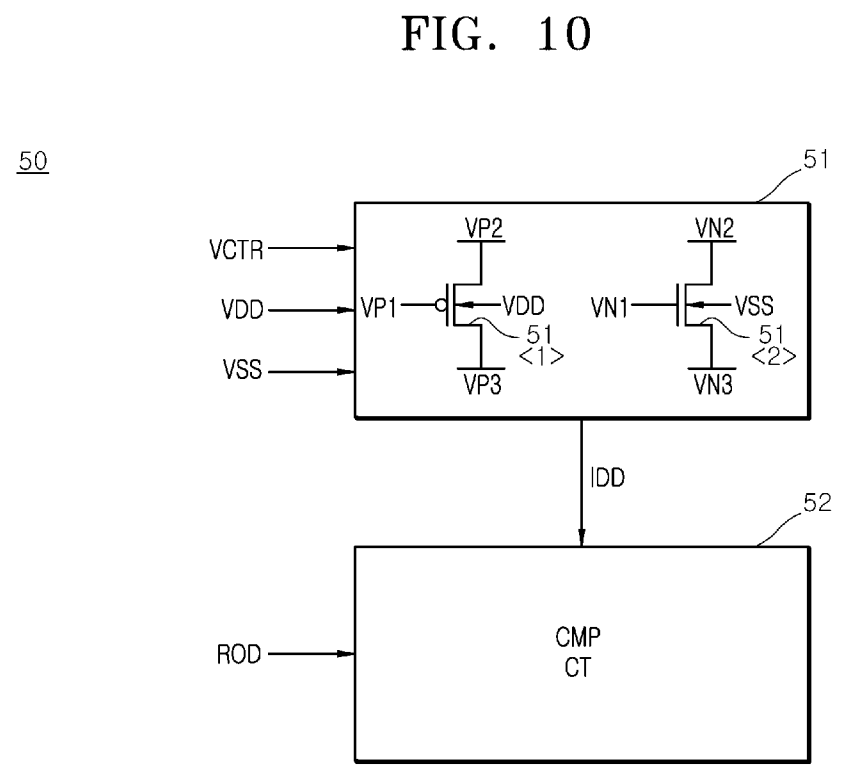

FIG. 10 is a block diagram illustrating an embodiment of the detection circuit 50 of the electronic device 1. The detection circuit 50 includes a current generation circuit 51 and a measurement circuit (CMP CT) 52.

The current generation circuit 51 includes a first reference transistor 51<1> and a second reference transistor 51<2>.

The first reference transistor 51<1> is implemented as a PMOS transistor in the example of FIG. 10. The first reference transistor 51<1> is supplied with the source voltage VDD as a back bias voltage. When the voltage control signal VCTR is activated, during the stress process, a first voltage node VP1 of the first reference transistor 51<1> is supplied with the ground voltage VSS at the third voltage level (e.g., 0 V), a second voltage node VP2 of the first reference transistor 51<1> is supplied with the source voltage VDD at the first voltage level (e.g., 1.65 V), and a third voltage node VP3 of the first reference transistor 51<1> is supplied with the source voltage VDD at the first voltage level (e.g., 1.65 V), such that stress is applied to the first reference transistor 51<1>. When the voltage control signal VCTR is disabled or deactivated, during the measurement process, the first voltage node VP1 of the first reference transistor 51<1> is supplied with the ground voltage VSS at the third voltage level (e.g., 0 V), the second voltage node VP2 of the first reference transistor 51<1> is supplied with the source voltage VDD at the second voltage level (e.g., 1.35 V), and the third voltage node VP3 of the first reference transistor 51<1> is supplied with the ground voltage VSS at the third voltage level (e.g., 0 V), such that the first reference transistor 51<1> performs as a diode.

The second reference transistor 51<2> is implemented as an NMOS transistor in the example of FIG. 10. The second reference transistor 51<2> is supplied with the ground voltage VSS as a back bias voltage. When the voltage control signal VCTR is activated, during the stress process, a fourth voltage node VN1 of the second reference transistor 51<2> is supplied with the source voltage VDD at the first voltage level (e.g., 1.65 V), a fifth voltage node VN2 of the second reference transistor 51<2> is supplied with the ground voltage VSS at the third voltage level (e.g., 0 V), and a sixth voltage node VN3 of the second reference transistor 51<2> is supplied with the ground voltage VSS at the third voltage level (e.g., 0 V), such that stress is applied to the second reference transistor 51<2>. When the voltage control signal VCTR is disabled or deactivated, during the measurement process, the fourth voltage node VN1 of the second reference transistor 51<2> is supplied with the source voltage VDD at the second voltage level (e.g., 1.35 V), the fifth voltage node VN2 of the second reference transistor 51<2> is supplied with the source voltage VDD at the second voltage level (e.g., 1.35 V), and the sixth voltage node VN3 of the second reference transistor 51<2> is supplied with the ground voltage VSS at the third voltage level (e.g., 0 V), such that the second reference transistor 51<2> performs as a diode.

The current generation circuit 51 applies stress to the first reference transistor 51<1> and the second reference transistor 51<2> during the stress process when the voltage control signal VCTR is activated. The current generation circuit 51 generates the internal current IDD by the first reference transistor 51<1> and the second reference transistor 51<2> to which the stress is applied during the measurement process when the voltage control signal VCTR is deactivated. The amount of the internal current IDD varies due to degradation by the first reference transistor 51<1> and the second reference transistor 51<2> to which the stress is applied.

The measurement circuit 52 measures the degradation amount of the internal current IDD and the degradation amount of the cycle signal ROD. The measurement circuit 52 measures the degradation amount of the first reference transistor 51<1> and the second reference transistor 51<2> by detecting the amount or value of the internal current IDD. The measurement circuit 52 measures the degradation amount of the first reference transistor 51<1> and the second reference transistor 51<2> by comparing the amount of the internal current IDD that is generated by the first reference transistor 51<1> and the second reference transistor 51<2> during the state when stress is not applied to the first reference transistor 51<1> and the second reference transistor 51<2> to the amount of the internal current IDD that is generated by the first reference transistor 51<1> and the second reference transistor 51<2> when stress is applied. The measurement circuit 52 measures the degradation amount of a plurality of PMOS transistors and a plurality of NMOS transistors that are included in the cycle signal generation circuit 40 by detecting the frequency of the cycle signal ROD. The measurement circuit 52 measures the degradation amount of a plurality of PMOS transistors and a plurality of NMOS transistors that are included in the cycle signal generation circuit 40 by comparing the frequency of the cycle signal ROD that is generated by the plurality of PMOS transistors and the plurality of NMOS transistors during the state when stress is not applied to the cycle signal generation circuit 40 to the frequency of the cycle signal ROD that is generated by the plurality of PMOS transistors and the plurality of NMOS transistors that are included in the cycle signal generation circuit 40 when stress is applied. The measurement circuit 52 detects mutual consistency between the degradation amount of the first reference transistor 51<1> and the second reference transistor 51<2> that are included in the current generation circuit 51 and the degradation amount of the plurality of PMOS transistors and the plurality of NMOS transistors that are included in the cycle signal generation circuit 40 by detecting the amount of the internal current IDD and the frequency of the cycle signal ROD. Operation of the measurement circuit 52 detecting mutual consistency between the degradation amount of the first reference transistor 51<1> and the second reference transistor 51<2> that are included in the current generation circuit 51 and the degradation amount of the plurality of PMOS transistors and the plurality of NMOS transistors that are included in the cycle signal generation circuit 40 is described in detail with reference to FIG. 11.

FIG. 11 is a table showing examples of degradation and mutual consistency values determined by the detection circuit 50 according to an embodiment. Examples of mutual consistency values between the degradation amount of a plurality of transistors that are included in the cycle signal generation circuit 40 and the degradation amount of the first reference transistor 51<1> and the second reference transistor 51<2> that are included in the current generation circuit 51 according to stress times during the stress process of the electronic device 1 are shown in the table of FIG. 11 according to an embodiment of the present disclosure. In this example, the degradation amount indicates a value that is obtained by dividing a frequency variance (ΔFreq) of the cycle signal ROD that is generated by the transistors to which stress is applied during the measurement process by a current variance (ΔI) that flows into the first reference transistor 51<1> and the second reference transistor 51<2>.

When the time period during which stress is applied is 1 second (Sec), the degradation amount (Degradation (ROD) of the plurality of transistors that are included in the cycle signal generation circuit 40 is 1.79%, and the degradation amount (Degradation IDD) of the first reference transistor 51<1> and the second reference transistor 51<2> that are included in the current generation circuit 51 is 1.81%. In this example, mutual consistency between the degradation amount of the plurality of transistors that are included in the cycle signal generation circuit 40 and the degradation amount of the first reference transistor 51<1> and the second reference transistor 51<2> that are included in the current generation circuit 51 is 98.9%.

When the time period during which stress is applied is 10 Sec, the degradation amount (Degradation (ROD) of the plurality of transistors that are included in the cycle signal generation circuit 40 is 2.41% and the degradation amount (Degradation IDD) of the first reference transistor 51<1> and the second reference transistor 51<2> that are included in the current generation circuit 51 is 2.44%. In this example, mutual consistency between the degradation amount of the plurality of transistors that are included in the cycle signal generation circuit 40 and the degradation amount of the first reference transistor 51<1> and the second reference transistor 51<2> that are included in the current generation circuit 51 is 98.8%.

When the time period during which stress is applied is 100 Sec, the degradation amount (Degradation (ROD) of the plurality of transistors that are included in the cycle signal generation circuit 40 is 3.32% and the degradation amount (Degradation IDD) of the first reference transistor 51<1> and the second reference transistor 51<2> that are included in the current generation circuit 51 is 3.32%. In this example, mutual consistency between the degradation amount of the plurality of transistors that are included in the cycle signal generation circuit 40 and the degradation amount of the first reference transistor 51<1> and the second reference transistor 51<2> that are included in the current generation circuit 51 is 100%.

When the time period during which stress is applied is 1,000 Sec, the degradation amount (Degradation (ROD) of the plurality of transistors that are included in the cycle signal generation circuit 40 is 4.50% and the degradation amount (Degradation IDD) of the first reference transistor 51<1> and the second reference transistor 51<2> that are included in the current generation circuit 51 is 4.50%. In this example, mutual consistency between the degradation amount of the plurality of transistors that are included in the cycle signal generation circuit 40 and the degradation amount of the first reference transistor 51<1> and the second reference transistor 51<2> that are included in the current generation circuit 51 is 100.0%.

When the time period during which stress is applied is 10,000 Sec, the degradation amount (Degradation (ROD) of the plurality of transistors that are included in the cycle signal generation circuit 40 is 6.15% and the degradation amount (Degradation IDD) of the first reference transistor 51<1> and the second reference transistor 51<2> that are included in the current generation circuit 51 is 6.10%. In this example, mutual consistency between the degradation amount of the plurality of transistors that are included in the cycle signal generation circuit 40 and the degradation amount of the first reference transistor 51<1> and the second reference transistor 51<2> that are included in the current generation circuit 51 is 100.8%.

When the time period during which stress is applied is 100,000 Sec, the degradation amount (Degradation (ROD)) of the plurality of transistors that are included in the cycle signal generation circuit 40 is 8.30% and the degradation amount (Degradation IDD)) of the first reference transistor 51<1> and the second reference transistor 51<2> that are included in the current generation circuit 51 is 8.28%. In this example, mutual consistency between the degradation amount of the plurality of transistors that are included in the cycle signal generation circuit 40 and the degradation amount of the first reference transistor 51<1> and the second reference transistor 51<2> that are included in the current generation circuit 51 is 100.2%.

When the time period during which stress is applied is 1,000,000 Sec, the degradation amount (Degradation (ROD)) of the plurality of transistors that are included in the cycle signal generation circuit 40 is 11.30% and the degradation amount (Degradation IDD)) of the first reference transistor 51<1> and the second reference transistor 51<2> that are included in the current generation circuit 51 is 11.24%. In this example, mutual consistency between the degradation amount of the plurality of transistors that are included in the cycle signal generation circuit 40 and the degradation amount of the first reference transistor 51<1> and the second reference transistor 51<2> that are included in the current generation circuit 51 is 100.5%.

As described above, the electronic device 1 according to an embodiment of the present disclosure may quickly apply stress to the plurality of transistors that are included in the cycle signal generation circuit 40 by blocking the current paths of the plurality of transistors that are included in the cycle signal generation circuit 40 during the stress process, and may detect whether the degradation amount of the plurality of transistors that are included in the cycle signal generation circuit 40 and the degradation amount of the reference transistors 51<1> and 51<2> are identically set by monitoring the frequency of the cycle signal ROD that is generated by the cycle signal generation circuit 40 and monitoring the internal current IDD that is generated by the reference transistors 51<1> and 51<2> to which stress is applied during the measurement process. The electronic device 1 may accurately detect the degradation amount of a transistor that is actually used by monitoring the frequency of the cycle signal ROD. The electronic device 1 may apply stress to the plurality of transistors that are included in the cycle signal generation circuit 40 by supplying the plurality of transistors with the source voltage at a high voltage level during the stress process and may monitor the frequency of the cycle signal ROD by generating the cycle signal ROD through the plurality of transistors to which the stress is applied during the measurement process. The electronic device 1 may quickly apply stress to the plurality of transistors that are included in the cycle signal generation circuit 40 by blocking the current paths of the plurality of transistors that are included in the cycle signal generation circuit 40 during the stress process.

Figure 12:
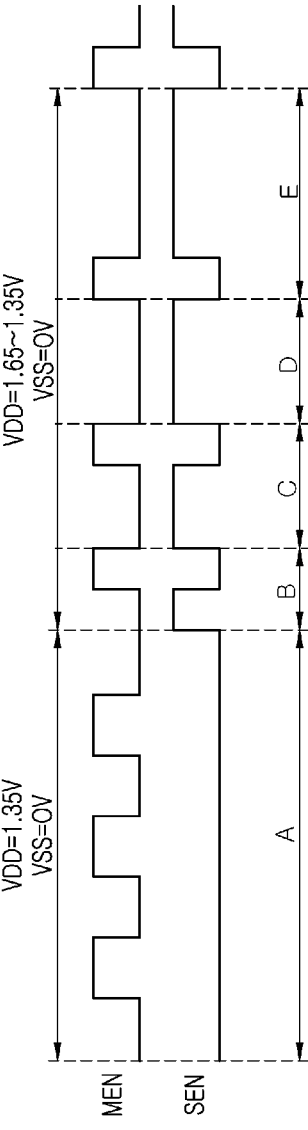
FIG. 12 is a timing diagram during operation of the electronic device according to an embodiment of the present disclosure.

FIG. 12 is a timing diagram during operation of the electronic device 1 according to an embodiment of the present disclosure. Operation of the electronic device 1 according to an embodiment of the present disclosure is described with reference to FIG. 12. In this example, operation of increasing the time during which stress is applied is described as follows.

During interval A, for example, an operation in which the time during which stress is applied is 0 Sec, when the measurement process is performed three times, the source voltage VDD is generated at the second voltage level (e.g., 1.35 V), and the ground voltage VSS is generated at the third voltage level (e.g., 0 V).

During interval B, for example, an operation when the time during which stress is applied is 1 Sec, when the stress enable signal SEN is activated at a logic high level during the stress process, the source voltage VDD is generated at the first voltage level (e.g., 1.65 V), and the ground voltage VSS is generated at the third voltage level (e.g., 0 V).

The cycle signal generation circuit 40 applies stress to a plurality of transistors that are included in the cycle signal generation circuit 40 by supplying the plurality of transistors with the source voltage VDD at the first voltage level (e.g., 1.65 V) and the ground voltage VSS at the third voltage level (e.g., 0 V) when the stress enable signal SEN is activated at a logic high level during the stress process.

During the stress process, the current generation circuit 51 applies stress to the first reference transistor 51<1> and the second reference transistor 51<2> by supplying the source voltage VDD at the first voltage level (e.g., 1.65 V) and the ground voltage VSS at the third voltage level (e.g., 0 V) based on the voltage control signal VCTR.

During the measurement process, the current generation circuit 51 generates the internal current IDD through the first reference transistor 51<1> and the second reference transistor 51<2> to which stress is applied by supplying the source voltage VDD at the second voltage level (e.g., 1.35 V) and the ground voltage VSS at the third voltage level (e.g., 0 V) based on the voltage control signal VCTR.

The measurement circuit 52 monitors mutual consistency between the degradation amount of the plurality of transistors that are included in the cycle signal generation circuit 40 and the degradation amount of the first reference transistor 51<1> and the second reference transistor 51<2> by comparing the degradation amount of the frequency of the cycle signal ROD that is generated by the cycle signal generation circuit 40 and the degradation amount of the internal current IDD that is generated by the first reference transistor 51<1> and the second reference transistor 51<2>.

The same operation as performed during the interval A is performed during interval C, for example, an operation in which the time during which stress is applied is 10 Sec, during an interval D, for example, an operation in which the time during which stress is applied is 100 Sec, and during an interval E, for example, an operation in which the time during which stress is applied is 100 Sec. Detailed descriptions of the operations during the intervals C, D, and E are described above.

As described above, the electronic device 1 according to an embodiment of the present disclosure may quickly apply stress to the plurality of transistors that are included in the cycle signal generation circuit 40 by blocking the current paths of the plurality of transistors that are included in the cycle signal generation circuit 40 during the stress process, and may monitor whether the degradation amount of the plurality of transistors that are included in the cycle signal generation circuit 40 and the degradation amount of the reference transistors 51<1> and 51<2> are identically set by detecting the frequency of the cycle signal ROD that is generated by the cycle signal generation circuit 40 and the amount of the internal current IDD that is generated by the reference transistors 51<1> and 51<2> to which stress is applied during the measurement process. The electronic device 1 may apply stress to the plurality of transistors that are included in the cycle signal generation circuit 40 by supplying the plurality of transistors with the source voltage at a high voltage level during the stress process and may monitor the frequency of the cycle signal ROD by generating the cycle signal ROD through the plurality of transistors to which the stress is applied during the measurement process. The electronic device 1 may quickly apply stress to the plurality of transistors that are included in the cycle signal generation circuit 40 by blocking the current paths of the plurality of transistors that are included in the cycle signal generation circuit 40 during the stress process.

Figure 13:
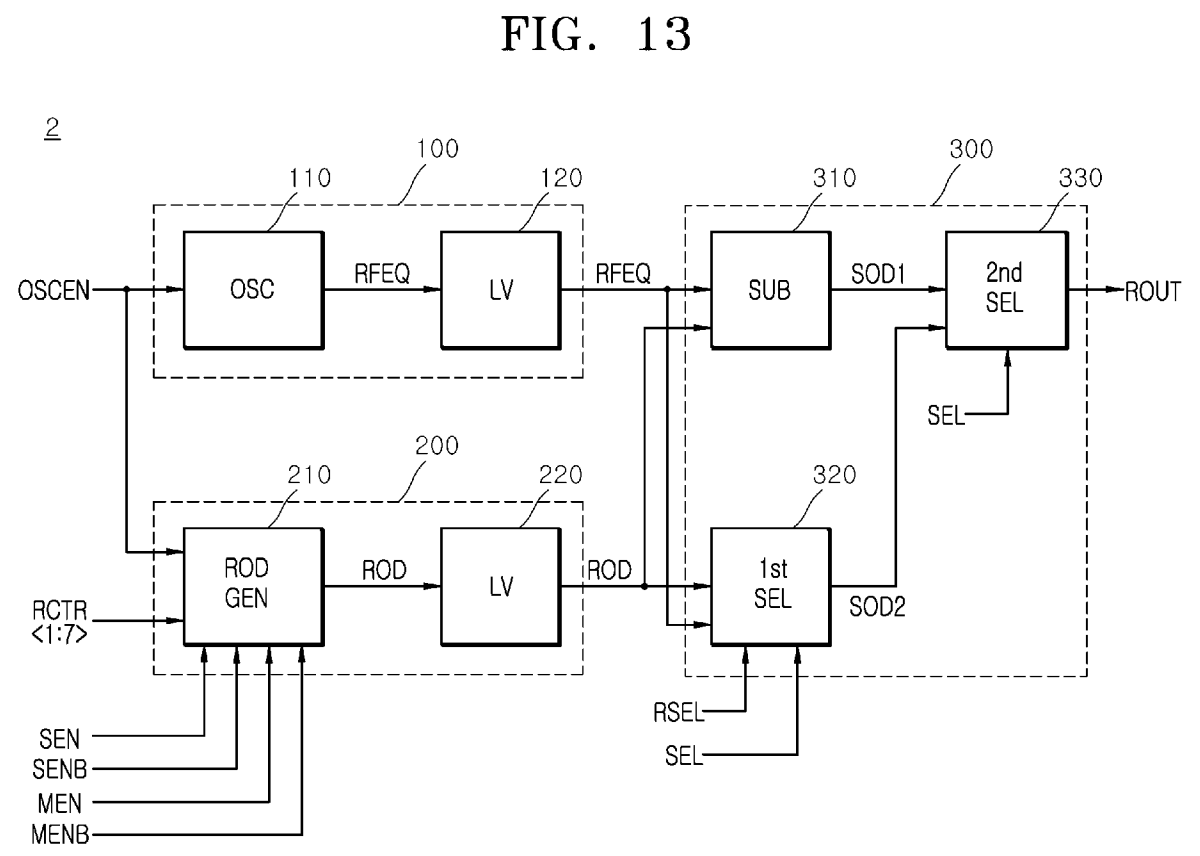

FIG. 13 is a block diagram illustrating an electronic device 2 according to another embodiment of the present disclosure. As illustrated in FIG. 13, the electronic device 2 includes a first internal device 100, a second internal device 200, and a cycle signal output device 300.

The first internal device 100 includes a reference frequency signal generation circuit (OSC) 110 and a first level shifter (LV) 120.

The reference frequency signal generation circuit 110 generates a reference frequency signal RFEQ that is cyclically toggled when the cycle signal enable signal OSCEN is activated. The reference frequency signal generation circuit 110 generates the reference frequency signal RFEQ that is cyclically toggled by a plurality of transistors (not illustrated) to which stress is not applied. The reference frequency signal generation circuit 110 may be implemented with the same circuit as the cycle signal generation circuit 40 illustrated in FIG. 1 and FIG. 8 but may generate the reference frequency signal RFEQ that is cyclically toggled from the plurality of transistors (not illustrated) to which stress is not applied.

The first level shifter 120 outputs the reference frequency signal RFEQ by amplifying the voltage level of the reference frequency signal RFEQ. The first level shifter 120 may output the reference frequency signal RFEQ by amplifying the voltage level of the reference frequency signal RFEQ at a low voltage level into a CMOS voltage level.

The first internal device 100 generates the reference frequency signal RFEQ that is cyclically toggled when the cycle signal enable signal OSCEN is activated. The first internal device 100 generates the reference frequency signal RFEQ that is cyclically toggled by the plurality of transistors (not illustrated) to which stress is not applied when the cycle signal enable signal OSCEN is activated.

The second internal device 200 includes a cycle signal generation circuit (ROD GEN) 210 and a second level shifter (LV) 220.

The cycle signal generation circuit 210 applies stress to a plurality of transistors by supplying the plurality of transistors with a source voltage VDD and a ground voltage VSS when a stress enable signal SEN and an inverted stress enable signal SENB are activated during the stress process. The cycle signal generation circuit 210 blocks the current paths of the plurality of transistors when a measurement enable signal MEN and an inverted measurement enable signal MENB are deactivated during the stress process. The cycle signal generation circuit 210 applies stress to the plurality of transistors by supplying the plurality of transistors with the source voltage VDD at the first voltage level (e.g., 1.65 V) and the ground voltage VSS at the third voltage level (e.g., 0 V) when the stress enable signal SEN and the inverted stress enable signal SENB are activated during the stress process. The cycle signal generation circuit 210 connects the current paths of the plurality of transistors to which stress is applied when the measurement enable signal MEN and the inverted measurement enable signal MENB are activated during the measurement process. During the measurement process, the cycle signal generation circuit 210 is supplied with the source voltage VDD at the second voltage level (e.g., 1.35 V) and the ground voltage VSS at the third voltage level (e.g., 0 V) when the cycle signal enable signal OSCEN is enabled and generates a cycle signal ROD that is cyclically toggled through the plurality of transistors to which stress is applied. In the cycle signal generation circuit 210, when the measurement enable signal MEN is activated at a logic high level during the measurement process, a resistance value of the variable resistor (for example, 44<1> in FIG. 8) is adjusted by the first resistance control signal through the seventh resistance control signal RCTR<1:7>, such that the degradation amount of the plurality of transistors is adjusted. The cycle signal generation circuit 210 may be implemented with the same circuit as the cycle signal generation circuit 40 illustrated in FIG. 1 and FIG. 8 and may be implemented to perform the same operation as the cycle signal generation circuit 40.

The second level shifter 220 may output the cycle signal ROD by amplifying the voltage level of the cycle signal ROD. The second level shifter 220 may output the cycle signal ROD by amplifying the voltage level of the cycle signal ROD at a low voltage level into the CMOS voltage level.

The second internal device 200 blocks the current paths of the plurality of transistors when the measurement enable signal MEN and the inverted measurement enable signal MENB are deactivated during the stress process. The second internal device 200 applies stress to the plurality of transistors by supplying the plurality of transistors with the source voltage VDD at the first voltage level (e.g., 1.65 V) and the ground voltage VSS at the third voltage level (e.g., 0 V) when the stress enable signal SEN and the inverted stress enable signal SENB are activated during the stress process. The second internal device 200 connects the current paths of the plurality of transistors to which stress is applied when the measurement enable signal MEN and the inverted measurement enable signal MENB are activated during the measurement process. During the measurement process, the second internal device 200 is supplied with the source voltage VDD at the second voltage level (e.g., 1.35 V) and the ground voltage VSS at the third voltage level (e.g., 0 V) when the cycle signal enable signal OSCEN is activated and generates the cycle signal ROD that is cyclically toggled through the plurality of transistors to which stress is applied.

The cycle signal output device 300 includes a subtraction circuit (SUB) 310, a first selection transfer circuit (1st SEL) 320, and a second selection transfer circuit (2nd SEL) 330. The subtraction circuit 310 may be implemented with a flip-flop. The subtraction circuit 310 latches the cycle signal ROD in synchronization with the reference frequency signal RFEQ. The subtraction circuit 310 outputs the latched cycle signal ROD as a first selection cycle signal SOD1 in synchronization with the reference frequency signal RFEQ. The subtraction circuit 310 may generate the first selection cycle signal SOD1 regardless of noise that occurs from an external device (not illustrated) by outputting the latched cycle signal ROD as the first selection cycle signal SOD1 in synchronization with the reference frequency signal RFEQ.

The first selection transfer circuit 320 generates the second selection cycle signal SOD2 from any one of the reference frequency signal RFEQ and the cycle signal ROD according to a reference selection signal RSEL and a subtraction selection signal SEL. The first selection transfer circuit 320 generates the second selection cycle signal SOD2 from the reference frequency signal RFEQ when the reference selection signal RSEL is activated. The first selection transfer circuit 320 generates the second selection cycle signal SOD2 by dividing the frequency of the reference frequency signal RFEQ, for example, by reducing the frequency of the reference frequency signal RFEQ by an integer value, when the reference selection signal RSEL is activated. The first selection transfer circuit 320 includes a frequency division circuit (not illustrated) according to an embodiment and outputs the reference frequency signal RFEQ as the second selection cycle signal SOD2 by dividing the frequency of the reference frequency signal RFEQ. The first selection transfer circuit 320 generates the second selection cycle signal SOD2 from the cycle signal ROD when the subtraction selection signal SEL is activated. The first selection transfer circuit 320 generates the second selection cycle signal SOD2 by dividing the frequency of the cycle signal ROD when the subtraction selection signal SEL is activated. The first selection transfer circuit 320 includes the frequency division circuit (not illustrated) according to an embodiment and outputs the cycle signal ROD as the second selection cycle signal SOD2 by dividing the frequency of the cycle signal ROD. The reference selection signal RSEL is set as a signal that is activated in order to output, as the second selection cycle signal SOD2, the reference frequency signal RFEQ that is generated through a transistor to which stress is not applied. The subtraction selection signal SEL is set as a signal that is activated in order to output the cycle signal ROD that is generated regardless of noise that occurs from an external device (not illustrated).

The second selection transfer circuit 330 generates a cycle output signal ROUT from one of the first selection cycle signal SOD1 and the second selection cycle signal SOD2 based on the subtraction selection signal SEL. The second selection transfer circuit 330 generates the cycle output signal ROUT from the first selection cycle signal SOD1 when the subtraction selection signal SEL is activated. The second selection transfer circuit 330 may include a driver (not illustrated) according to an embodiment and may output the first selection cycle signal SOD1 as the cycle output signal ROUT by driving the first selection cycle signal SOD1 in accordance with driving power of a line from which the cycle output signal ROUT is output when the subtraction selection signal SEL is activated. The second selection transfer circuit 330 may generate the cycle output signal ROUT from the second selection cycle signal SOD2 when the subtraction selection signal SEL is deactivated. The second selection transfer circuit 330 may include the driver (not illustrated) according to an embodiment and may output the second selection cycle signal SOD2 as the cycle output signal ROUT by driving the second selection cycle signal SOD2 in accordance with driving power of a line from which the cycle output signal ROUT is output when the subtraction selection signal SEL is deactivated.

The cycle signal output device 300 generates the cycle output signal ROUT from one of the reference frequency signal RFEQ and the cycle signal ROD by the reference selection signal RSEL and the subtraction selection signal SEL. The cycle signal output device 300 generates the cycle output signal ROUT from the reference frequency signal RFEQ when the reference selection signal RSEL is activated. The cycle signal output device 300 generates the first selection cycle signal SOD1 from the latched cycle signal ROD in synchronization with the reference frequency signal RFEQ when the subtraction selection signal SEL is activated and outputs the first selection cycle signal SOD1 as the cycle output signal ROUT. The cycle output signal ROUT may be output to a test device (not illustrated) that is provided outside the electronic device 2. The test device (not illustrated) may be a device that includes the measurement circuit 52 illustrated in FIG. 1 and FIG. 10 and that monitors the frequency of the cycle output signal ROUT.

As described above, the electronic device 2 according to another embodiment of the present disclosure may apply stress to the plurality of transistors that are included in the cycle signal generation circuit 210 by supplying the plurality of transistors with the source voltage at a high voltage level during the stress process, and may generate the cycle signal ROD through the plurality of transistors to which the stress is applied, output the generated cycle signal ROD as the cycle output signal ROUT, and monitor the frequency of the cycle output signal ROUT during the measurement process. The electronic device 2 may quickly apply stress to the plurality of transistors that are included in the cycle signal generation circuit 210 by blocking the current paths of the plurality of transistors that are included in the cycle signal generation circuit 210 during the stress process and may generate the cycle signal ROD by the cycle signal generation circuit 210, output the generated cycle signal ROD as the cycle output signal ROUT, and monitor the frequency of the cycle output signal ROUT during the measurement process. The electronic device 2 may quickly apply stress to the plurality of transistors that are included in the cycle signal generation circuit 210 by blocking the current paths of the plurality of transistors that are included in the cycle signal generation circuit 210 during the stress process.

Figure 14:
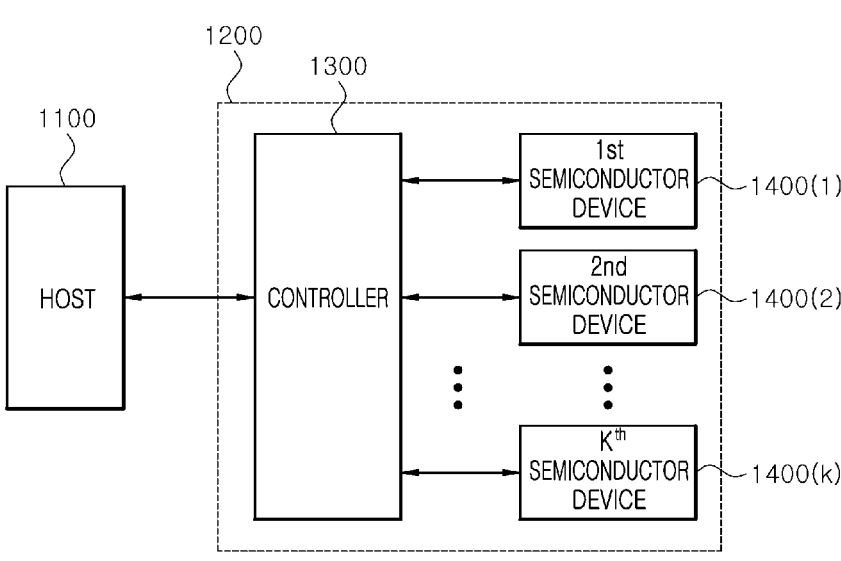
FIG. 14 is a diagram illustrating an embodiment of an electronic system including the electronic device illustrated in FIG. 1 and FIG. 13.

FIG. 14 is a block diagram illustrating an electronic system 1000 according to an embodiment of the present disclosure. As illustrated in FIG. 14, the electronic system 1000 includes a host 1100 and a semiconductor system 1200.

The host 1100 and the semiconductor system 1200 mutually transmit signals using an interface protocol. The interface protocol that is used between the host 1100 and the semiconductor system 1200 may include a multi-media card (MMC), an enhanced small disk interface (ESDI), integrated drive electronics (IDE), peripheral component interconnectexpress (PCI-E), advanced technology attachment (ATA), serial ATA (SATA), parallel ATA (PATA), a serial attached SCSI (SAS), and a universal serial bus (USB).

The semiconductor system 1200 includes a controller 1300 and semiconductor devices 1400(K:1). The controller 1300 controls the semiconductor devices 1400(K:1) such that the semiconductor devices 1400(K:1) each perform internal operations. The semiconductor devices 1400(K:1) each apply stress to the plurality of transistors that are included in the cycle signal generation circuit by supplying the plurality of transistors with the source voltage at a high voltage level during the stress process. Each semiconductor device 1400(K:1) monitors the frequency of the cycle signal ROD by generating the cycle signal ROD through the plurality of transistors to which the stress is applied during the measurement process. Each semiconductor device 1400 (K:1) quickly applies stress to the plurality of transistors that are included in the cycle signal generation circuit by blocking the current paths of the plurality of transistors that are included in the cycle signal generation circuit during the stress process. Each semiconductor device 1400(K:1) quickly applies stress to the plurality of transistors that are included in the cycle signal generation circuit by blocking the current paths of the plurality of transistors that are included in the cycle signal generation circuit during the stress process and detects whether the degradation amount of the plurality of transistors that are included in the cycle signal generation circuit and the degradation amount of the reference transistors are identically set by comparing the degradation amount of the frequency of the cycle signal ROD that is generated by the cycle signal generation circuit and the degradation amount of the internal current IDD that is generated by the reference transistors to which stress is applied during the measurement process. Each semiconductor device 1400(K:1) quickly applies stress to the plurality of transistors that are included in the cycle signal generation circuit 210 by blocking the current paths of the plurality of transistors during the stress process and generates the cycle signal that is insensitive to noise by latching the cycle signal ROD that is generated by the cycle signal generation circuit 210 as the reference frequency signal RFEQ that is generated by the plurality of transistors to which stress is not applied during the measurement process. Each semiconductor devices 1400(K:1) may accurately detect the degradation amount of a transistor that actually operates by monitoring the cycle signal that is insensitive to noise.

The semiconductor devices 1400(K:1) may each be implemented as the electronic device 1 illustrated in FIG. 1 or the electronic device 2 illustrated in FIG. 13. The semiconductor devices 1400(K:1) according to an embodiment may each implemented as one of dynamic random access memory (DRAM), phase change random access memory (PRAM), resistive random access memory (RRAM), magnetic random access memory (MRAM), and ferroelectric random access memory (FRAM).

What is claimed is:

1. An electronic device comprising:
   a control signal generation circuit configured to generate a stress enable signal to enter a stress process and a measurement enable signal to enter a measurement process based on a voltage control signal and configured to generate a cycle signal enable signal for generating a cycle signal; and
   a cycle signal generation circuit configured to apply stress to a plurality of transistors by supplying the plurality of transistors with a source voltage and a ground voltage when the stress enable signal is activated during the stress process, configured to connect current paths of the plurality of transistors to which the stress is applied when the measurement enable signal is activated during the measurement process, and configured to generate the cycle signal that is cyclically toggled when the cycle signal enable signal is activated, and
   wherein the source voltage is generated at a first voltage level during the stress process, the source voltage is generated at a second voltage level during the measurement process, and the first voltage level is higher than the second voltage level.

2. The electronic device of claim 1, wherein the cycle signal generation circuit blocks the current paths of the plurality of transistors when the measurement enable signal is deactivated during the stress process.

3. The electronic device of claim 1, wherein the cycle signal generation circuit is configured to generate the cycle signal that is cyclically toggled through the plurality of transistors to which the stress is applied when the cycle signal enable signal is activated.

4. The electronic device of claim 1, wherein the control signal generation circuit comprises:
   a stress enable signal generation circuit configured to generate the stress enable signal and an inverted stress enable signal that are activated when the voltage control signal is activated;
   a measurement enable signal generation circuit configured to generate the measurement enable signal and an inverted measurement enable signal that are activated when the voltage control signal is deactivated; and
   a cycle signal enable signal generation circuit configured to generate the cycle signal enable signal by buffering an outside enable signal.

5. The electronic device of claim 1, wherein the cycle signal generation circuit comprises:
   a first supply voltage generation circuit configured to apply the stress to a plurality of PMOS transistors using the source voltage and the ground voltage when the stress enable signal is activated and configured to generate a first supply voltage through the plurality of PMOS transistors to which the stress is applied;
   a second supply voltage generation circuit configured to apply the stress to a plurality of NMOS transistors using the source voltage and the ground voltage when the stress enable signal is activated and configured to generate a second supply voltage through the plurality of NMOS transistors to which the stress is applied;
   a connection circuit configured to connect a first node that is driven by the plurality of PMOS transistors and a second node that is driven by the plurality of NMOS transistors when the measurement enable signal is activated; and
   an oscillator configured to receive the first supply voltage and the second supply voltage and configured to generate the cycle signal that is cyclically toggled when the cycle signal enable signal is activated.

6. The electronic device of claim 5, wherein:
   the stress is applied to the plurality of PMOS transistors at the source voltage having a first voltage level when the stress enable signal is activated, and
   the stress is applied to the plurality of NMOS transistors at the source voltage having the first voltage level when the stress enable signal is activated.

7. The electronic device of claim 5, wherein the oscillator comprises:

an input signal generation circuit configured to generate an input signal by inverting the cycle signal when the cycle signal enable signal is activated;

a first inverter configured with the first supply voltage and the second supply voltage and configured to generate a first delay signal by inverting the input signal;

a second inverter configured with the first supply voltage and the second supply voltage and configured to generate a second delay signal by inverting the first delay signal;

a third inverter configured with the first supply voltage and the second supply voltage and configured to generate a third delay signal by inverting the second delay signal; and a fourth inverter configured with the first supply voltage and the second supply voltage and configured to generate the cycle signal by inverting the third delay signal.

8. An electronic device comprising:

a control signal generation circuit configured to generate a stress enable signal to enter a stress process and a measurement enable signal to enter a measurement process based on a voltage control signal and configured to generate a cycle signal enable signal for generating a cycle signal;

a resistance control circuit configured to generate a resistance control signal based on an external resistance signal; and a cycle signal generation circuit configured to apply stress to a plurality of transistors when the stress enable signal is activated during the stress process, configured to connect current paths of the plurality of transistors to which the stress is applied when the measurement enable signal is activated during the measurement process, and configured to generate the cycle signal that is cyclically toggled when the cycle signal enable signal is activated;

wherein a degradation amount of the plurality of transistors attributable to the stress is adjusted based on the resistance control signal.

9. The electronic device of claim 8, wherein:

when a resistance value of the cycle signal generation circuit is decreased based on the resistance control signal, the degradation amount of the plurality of transistors attributable to the stress is decreased, and when the resistance value of the cycle signal generation circuit is increased based on the resistance control signal, the degradation amount of the plurality of transistors attributable to the stress is increased.

10. The electronic device of claim 8, wherein the cycle signal generation circuit is configured to apply the stress by supplying the plurality of transistors with a source voltage and a ground voltage when the stress enable signal is activated.

11. The electronic device of claim 8, wherein the cycle signal generation circuit is configured to generate the cycle signal that is cyclically toggled through the plurality of transistors to which the stress is applied when the cycle signal enable signal is activated.

12. The electronic device of claim 8, wherein the control signal generation circuit comprises:

a stress enable signal generation circuit configured to generate the stress enable signal and an inverted stress enable signal that are activated when the voltage control signal is activated;

a measurement enable signal generation circuit configured to generate the measurement enable signal and an inverted measurement enable signal that are activated when the voltage control signal is deactivated; and a cycle signal enable signal generation circuit configured to generate the cycle signal enable signal by buffering an outside enable signal.

13. The electronic device of claim 8, wherein the cycle signal generation circuit comprises:

a first supply voltage generation circuit configured to apply the stress to a plurality of PMOS transistors using a source voltage and a ground voltage when the stress enable signal is activated, configured to supply a first node with a first internal current through the plurality of PMOS transistors to which the stress is applied, and configured to generate a first supply voltage;

a second supply voltage generation circuit configured to apply the stress to a plurality of NMOS transistors using the ground voltage when the stress enable signal is activated, configured to discharge a second internal current to a third node through the plurality of NMOS transistors to which the stress is applied, and configured to generate a second supply voltage;

a connection circuit configured to connect a second node that is driven by the plurality of PMOS transistors and the third node that is driven by the plurality of NMOS transistors when the measurement enable signal is activated;

a degradation amount adjustment circuit connected to the first node and configured to adjust the degradation amount of the plurality of transistors attributable to the stress by adjusting a resistance value of the degradation amount adjustment circuit based on the resistance control signal when the measurement enable signal is activated; and an oscillator configured to receive the first supply voltage and the second supply voltage and configured to generate the cycle signal that is cyclically toggled when the cycle signal enable signal is activated.

14. The electronic device of claim 13, wherein:

the stress is applied to the plurality of PMOS transistors at the source voltage having a first voltage level when the stress enable signal is activated, and the stress is applied to the plurality of NMOS transistors at the source voltage having the first voltage level when the stress enable signal is activated.

15. The electronic device of claim 13, wherein the oscillator comprises:

an input signal generation circuit configured to generate an input signal by inverting the cycle signal when the cycle signal enable signal is activated;

a first inverter configured with the first supply voltage and the second supply voltage and configured to generate a first delay signal by inverting the input signal;

a second inverter configured with the first supply voltage and the second supply voltage and configured to generate a second delay signal by inverting the first delay signal;

a third inverter configured with the first supply voltage and the second supply voltage and configured to generate a third delay signal by inverting the second delay signal; and a fourth inverter configured with the first supply voltage and the second supply voltage and configured to generate the cycle signal by inverting the third delay signal.

16. The electronic device of claim 8, further comprising a detection circuit configured to be supplied with a source voltage and a ground voltage during the stress process based on the voltage control signal and configured to detect a frequency of the cycle signal during the measurement process based on the voltage control signal.

17. The electronic device of claim 16, wherein the detection circuit comprises:

a current generation circuit comprising a first reference transistor and a second reference transistor to which the stress is applied by the source voltage and the ground voltage during the stress process based on the voltage control signal and configured to generate an internal current, an amount of which is adjusted by the first reference transistor and the second reference transistor to which the stress is applied; and a measurement circuit configured to monitor mutual consistency between a degradation amount of the plurality of transistors that are included in the cycle signal generation circuit and a degradation amount of the first reference transistor and the second reference transistor by comparing a degradation amount of a frequency of the cycle signal and a degradation amount of the internal current.

18. An electronic device comprising:

a first internal device configured to generate a reference frequency signal that is cyclically toggled when a cycle signal enable signal is activated;

a second internal device configured to apply stress to a plurality of transistors by supplying the plurality of transistors with a source voltage and a ground voltage when a stress enable signal is activated during a stress process, configured to connect current paths of the plurality of transistors to which the stress is applied when a measurement enable signal is activated during a measurement process, and configured to generate a cycle signal that is cyclically toggled when the cycle signal enable signal is activated; and a cycle signal output device configured to latch the cycle signal in synchronization with the reference frequency signal and configured to generate a cycle output signal from the cycle signal that is latched and the reference frequency signal based on a reference selection signal and a subtraction selection signal.

19. The electronic device of claim 18, wherein the second internal device is configured to block the current paths of the plurality of transistors when the measurement enable signal is deactivated during the stress process.

20. The electronic device of claim 18, wherein the first internal device comprises:

a reference frequency signal generation circuit configured to generate the reference frequency signal that is cyclically toggled when the cycle signal enable signal is activated; and a first level shifter configured to output the reference frequency signal by amplifying a voltage level of the reference frequency signal.

21. The electronic device of claim 18, wherein the second internal device comprises:

a cycle signal generation circuit configured to apply the stress to the plurality of transistors by supplying the plurality of transistors with the source voltage and the ground voltage when the stress enable signal is activated during the stress process, configured to connect the current paths of the plurality of transistors to which the stress is applied when the measurement enable signal is activated during the measurement process, and configured to generate the cycle signal that is cyclically toggled when the cycle signal enable signal is activated; and a second level shifter configured to output the cycle signal by amplifying a voltage level of the cycle signal.

22. The electronic device of claim 18, wherein the cycle signal output device comprises:

a subtraction circuit configured to latch the cycle signal in synchronization with the reference frequency signal and configured to output, as a first selection cycle signal, the cycle signal that is latched;

a first selection transfer circuit configured to generate a second selection cycle signal from one of the reference frequency signal and the cycle signal based on the reference selection signal and the subtraction selection signal; and a second selection transfer circuit configured to generate the cycle output signal from one of the first selection cycle signal and the second selection cycle signal based on the subtraction selection signal.

23. A method comprising:

during a stress process, blocking current paths of a plurality of transistors and applying stress to the plurality of transistors by supplying the plurality of transistors with a source voltage and a ground voltage; and during a measurement process, connecting the current paths of the plurality of transistors and applying a cycle signal through the plurality of transistors, and wherein the source voltage is generated at a first voltage level during the stress process, the source voltage is generated at a second voltage level during the measurement process, and the first voltage level is higher than the second voltage level.

24. The method of claim 23, further comprising generating a stress enable signal to enter the stress process and generating a measurement enable signal to enter the measurement process in an electronic device.

25. The method of claim 23, further comprising:

measuring degradation amount of internal current by comparing an amount of internal current that is generated by at least one reference transistor when stress is applied to an amount of internal current that is generated by the at least one reference transistor when stress is not applied; and measuring the degradation amount of the plurality of transistors by comparing a frequency of the cycle signal generated by the plurality of transistors when stress is applied to a frequency of the cycle signal generated by the plurality of transistors when stress is not applied.

26. The method of claim 25, further comprising determining mutual consistency by comparing the degradation amount of internal current to the degradation amount of the plurality of transistors.

27. The method of claim 23, further comprising adjusting a resistance value to control an amount of current discharged during the measurement process.

* * * * *